(12) United States Patent
Gureev et al.

(10) Patent No.: US 12,261,233 B2
(45) Date of Patent: Mar. 25, 2025

(54) PHOTODETECTORS AND PHOTODETECTOR ARRAYS

(71) Applicant: ActLight SA, Lausanne (CH)

(72) Inventors: Maxim Gureev, Lausanne (CH); Denis Sallin, Lausanne (CH); Serguei Okhonin, Lausanne (CH)

(73) Assignee: ActLight SA, Lausanne (CH)

( * ) Notice: Subject to any disclaimer, the term of this patent is extended or adjusted under 35 U.S.C. 154(b) by 0 days.

(21) Appl. No.: 18/358,817

(22) Filed: Jul. 25, 2023

(65) Prior Publication Data

US 2023/0378386 A1 Nov. 23, 2023

Related U.S. Application Data

(63) Continuation of application No. 16/933,159, filed on Jul. 20, 2020, now Pat. No. 11,735,677.

(51) Int. Cl.
*H01L 25/18* (2023.01)
*G01J 1/42* (2006.01)
(Continued)

(52) U.S. Cl.
CPC ........ *H01L 31/035272* (2013.01); *G01J 1/42* (2013.01); *H01L 25/18* (2013.01);
(Continued)

(58) Field of Classification Search
CPC ............. H01L 31/035272; H01L 25/18; H01L 27/1463; H01L 27/14643; H01L 31/1037;
(Continued)

(56) References Cited

U.S. PATENT DOCUMENTS

| 4,484,210 A | 11/1984 | Shiraki et al. |
| 9,735,304 B1 | 8/2017 | Okhonin et al. |
| | (Continued) | |

FOREIGN PATENT DOCUMENTS

| CN | 102460763 A | 5/2012 |
| CN | 105849908 A | 8/2016 |
| | (Continued) | |

OTHER PUBLICATIONS

Fossum, et al., "A Review of the Pinned Photodiode for CCD and CMOS Image Sensors," IEEE Journal of the Electron Devices Society, vol. 2, No. 3, pp. 33-43, May 2014.
(Continued)

*Primary Examiner* — Tony Ko
(74) *Attorney, Agent, or Firm* — Wilmer Cutler Pickering Hale and Dorr LLP

(57) ABSTRACT

A dynamic photodiode detector or detector array having a light absorbing region of doped semiconductor material for absorbing photons. Electrons or holes generated by photon absorption are detected with a construction of oppositely heavily doped anode and cathode regions and a heavily doped ground region of the same doping type as the anode region. Photon detection involves switching the device from reverse bias to forward bias to create a depletion region enclosing the anode region. When a photon is then absorbed the electron or hole thereby generated drifts under the electric field induced by the biasing to the depletion region where it causes the anode-to-ground current to increase. Furthermore, the detector is configured such that anode-to-cathode current starts to flow once a threshold number of electrons or holes reaches the depletion region, where the threshold may be one to provide single photon detection.

19 Claims, 16 Drawing Sheets

(51) Int. Cl.
  *H01L 27/146* (2006.01)
  *H01L 31/0352* (2006.01)
  *H01L 31/103* (2006.01)
(52) U.S. Cl.
  CPC .... *H01L 27/1463* (2013.01); *H01L 27/14643* (2013.01); *H01L 31/1037* (2013.01)
(58) Field of Classification Search
  CPC ........... H01L 27/1446; H01L 31/02019; H01L 31/111; H01L 31/103; G01J 1/42
  See application file for complete search history.

(56) References Cited

U.S. PATENT DOCUMENTS

| | | | |
|---|---|---|---|
| 10,312,274 | B1 | 6/2019 | Stark |
| 11,183,524 | B2 | 11/2021 | Sato |
| 2011/0272561 | A1* | 11/2011 | Sanfilippo ....... H01L 31/022408 438/73 |
| 2012/0313155 | A1 | 12/2012 | Okhonin |
| 2014/0210035 | A1 | 7/2014 | Park et al. |
| 2014/0319640 | A1 | 10/2014 | Major et al. |
| 2018/0175095 | A1 | 6/2018 | Sallin et al. |
| 2019/0097075 | A1 | 3/2019 | Rae |
| 2019/0252570 | A1 | 8/2019 | Sallin et al. |
| 2019/0257950 | A1 | 8/2019 | Patanwala et al. |
| 2019/0312170 | A1 | 10/2019 | Roy |
| 2019/0353760 | A1 | 11/2019 | Hasegawa |
| 2020/0026031 | A1 | 1/2020 | Li |
| 2020/0096614 | A1 | 3/2020 | Amaya-Benitez |
| 2020/0135776 | A1 | 4/2020 | Finkelstein |
| 2020/0144436 | A1 | 5/2020 | Van Nieuwenhove et al. |
| 2020/0168649 | A1 | 5/2020 | Ingelberts |

FOREIGN PATENT DOCUMENTS

| | | |
|---|---|---|
| CN | 109155325 A | 1/2019 |
| CN | 110416335 A | 11/2019 |
| EP | 3570534 A1 | 11/2019 |
| JP | H09-331051 | 12/1997 |
| JP | 2006-210919 | 8/2006 |
| JP | 2016-066766 | 4/2016 |
| JP | 2018-088488 | 6/2018 |
| JP | 2018-190797 | 11/2018 |
| TW | 446196 U | 7/2001 |
| WO | WO-2014/021115 | 2/2014 |
| WO | WO-2018/167567 | 9/2018 |
| WO | WO-2020/212303 | 10/2020 |
| WO | WO-2020/212305 | 10/2020 |
| WO | WO-2021/009978 | 1/2021 |
| WO | WO-2021/009979 | 1/2021 |

OTHER PUBLICATIONS

Gureev Maxim et al., "Photodiodes: Dynamic Photodiodes Reach Single-Photon Sensitivity at Low Voltages, with Minimal Noise," Laser Focus World, Feb. 1, 2019 (10 pages).

Ingelberts H, et al., "A Current-Assisted CMOS Photonic Sampler with Two Taps for Fluorescence Lifetime Sensing," Proceedings of SPIE, vol. 9896, Apr. 29, 2016 (8 pages).

International Search Report received in International Application No. PCT/IB2021/000497 dated Dec. 22, 2021 (20 pages).

Okhonin, et al., "A Dynamic Operation of a PIN photodiode," Applied Physics Letters, American Institute of Physics, vol. 106, No. 3, Jan. 22, 2015 (6 pages).

Sallin, Denis, et al., "MOS-PN Hybrid Device With Minimum Dark Current for Sensitive Digital Photodetection," IEEE Photonics Technology Letters, IEEE, USA, vol. 26, No. 20, Oct. 15, 2014 pp. 2062-2065. (4 pages).

Takahashi, et al., "A 45 nm Stacked CMOS Image Sensor Process Technology for Submicron Pixel," Article, Sensors, MDPI, www.mdpi.com/journal/sensors, pp. 1-13, Basel, Switzerland, Dec. 5, 2017.

* cited by examiner

PHOTODETECTORS AND PHOTODETECTOR ARRAYS

CROSS-REFERENCE TO RELATED APPLICATIONS

This application is a continuation of U.S. patent application Ser. No. 16/933,159 filed Jul. 20, 2020, the disclosure of which is hereby incorporated herein by reference in its entirety.

FIELD OF THE INVENTION

The present disclosure relates to photodetectors including photodetector arrays.

BACKGROUND

A traditional pn or pin photodetector is operated by being held at a constant reverse bias voltage. Incident photons are absorbed in a light absorbing region to generate electron-hole pairs which are swept to the contacts, so that the magnitude of the photocurrent is proportional to the intensity of the light incident on the photodiode.

Another type of photodetector, referred to as a Dynamic Photodiode (DPD), is disclosed in US 2012/313155 A1 and subsequent patent applications from Actlight SA of Lausanne, Switzerland. A DPD operates using pulsed voltages that are switched from reverse bias to forward bias. Switching to forward bias induces a current to flow across the device structure. The onset of the flow of the current is not instantaneous, but rather occurs after a time delay from the onset of the light incidence. This time delay is referred to as the triggering time. DPDs are operated to measure light intensity on the basis that the triggering time is proportional to the inverse of the light intensity, so triggering time can be used as the measure of the intensity of the incident light. DPDs are compatible with integration into photodetector arrays.

For high sensitivity photon detection, a photodetector of a type referred to as an avalanche photodiode (APD) is often used. An APD operates under a high reverse bias voltage so that electron-hole pairs generated by photon absorption experience a sufficiently strong electric field to create an "avalanche" or multiplication of further carriers. APDs can be made so sensitive that absorption of a single photon is sufficient to generate the avalanche effect. Such APDs are called single-photon avalanche diodes (SPADs). SPAD arrays in which each pixel contains a SPAD are of current commercial interest for three-dimensional (3D) imaging. A known 3D sensor device comprises a SPAD array arranged in a common module alongside a pulsed laser source in the form of a vertical cavity surface emitting laser (VCSEL). A photon emitted from the VCSEL that is scattered off the image and reaches a pixel of the APD detector array has its time-of-flight (TOF) measured by suitable electronics that compares the pulse emission time with the photon detection time. The image-to-pixel distance is thus measured on a pixel-by-pixel and photon-by-photon basis. Sony group companies have a number of patent applications on SPADs and their use in TOF detectors including US2020096614A1, US2020144436A1, US2019353760A1 and EP3570534A1. STMicroelectronics group companies also have a number of patent applications and patents on SPADs and their use in TOF detectors such as US2019312170A1, U.S. Ser. No. 10/312,274B1, US2019097075A1, US2019257950A1 and US2020026031A1.

BRIEF SUMMARY OF THE INVENTION

The present invention relates to refining the DPD design to achieve improved sensitivity. In particular, by adopting the measures described herein a DPD can be manufactured that is sufficiently sensitive to be triggered by absorption of a single photon and thereby provide a single-photon detector. The proposed single-photon DPD provides an alternative to SPADs and is attractive for integration in single-photon detector arrays. When using a DPD as a single-photon detector, the DPD is configured such that absorption of one photon, and hence generation of only one electron-hole pair, is sufficient to induce photocurrent to flow across the device structure. Measurement of the triggering time is therefore not relevant in this mode of DPD operation, since each photon is being detected by the current onset, and then the device is reset to wait for another photon to be absorbed. However, the improved sensitivity provided by the measures disclosed herein is also useful when operating a DPD conventionally, i.e. when the DPD measures light intensity through triggering time.

The advantages of a single-photon sensing DPD over a SPAD are as follows:

i. DPD can have a lower operational voltage than a SPAD
ii. The DPD allows sensitivity to be tuned by changing the bias voltage, so that the same detector can be biased for single photon detection, 2-photon detection, 3-photon detection or a larger number of photons as desired. This feature helps to increase background light immunity, since sensitivity can be reduced when there is a significant background light signal while still retaining the ability to bias the DPP for detecting single photons per pixel when the background light signal is low enough. In an array, this can even be done on a pixel-by-pixel basis or pixel group basis, so that bright image areas are biased with reduced sensitivity compared to dark image areas.
iii. Easier to reduce pixel area in a detector array, since unlike an APD a DPD does not operate with high electric fields.

According to one aspect of the disclosure there is provided a photodetector device comprising:

a light absorbing region of doped semiconductor material bounded by upper, lower and side surfaces, the light absorbing region being configured to generate pairs of oppositely charged carriers in response to absorption of photons when light is incident on the device;

an anode region composed of a highly doped p-type or n-type semiconductor material and arranged in contact with the light absorbing region;

a cathode region composed of a highly doped n-type or p-type semiconductor material of opposite type to the anode region and arranged in contact with the light absorbing region;

a ground region composed of a highly doped p-type or n-type semiconductor material of the same types as the anode region and arranged in contact with the light absorbing region;

wherein the anode, cathode and ground regions are arranged in relation to each other and the light absorbing region such that, when the device is switched from reverse bias to forward bias for sensing, a depletion region is created in the light absorbing region adjacent the anode region, and current flows between the anode and ground regions, and, when the device is switched from reverse bias to forward
bias for sensing, a carrier of appropriate positive or
negative charge type generated in the light absorbing
region in response to photon absorption will be induced
by the forward bias to drift towards the depletion
region, the device being configured such that in
response to each said carrier reaching the depletion
region its associated charge causes the current between
the anode and ground regions to increase, and such that
a threshold number of said carriers arriving at the
depletion region is sufficient to induce a further current
to start to flow between the anode and cathode regions.

The said regions can be mutually arranged and doped and otherwise configured to provide single photon detection, detection of a discrete plural number of photons, or detection similar to a conventional DPD requiring a large number of photons to be absorbed. Namely, the threshold number of said carriers may be one to provide single photon detection or more than one to provide multiple photon detection.

In certain embodiments, the cathode and ground regions are configured such that the resistance, $R2$, between them is much greater than the resistance, $R1$, between the anode and cathode regions so that, when a voltage is applied between the anode and cathode regions, the voltage dropped between the anode and cathode regions is at least 10 times greater than the voltage dropped between the cathode and ground regions ($R2 \gg R1$).

In certain embodiments, the device further comprises at least one island of doped semiconductor material embedded in the light absorbing region adjacent the anode region. The or each island is oppositely doped to the light absorbing region. The (or each) island is arranged so that the island lies within the depletion region that is formed when the device is reset.

In certain embodiments, the anode region has a smaller depth than that of the cathode region, e.g. at least 2, 3, 4 or 5 times smaller. This reduces its capacitance.

Certain embodiments use a planar, layered construction based on the light absorbing region. In these embodiments, the different regions are formed in a layer. The layer has upper and lower surfaces. The anode and cathode regions may be co-located in the same one of the surfaces, i.e. either both on the upper surface or both on the lower surface. The ground region may also be co-located on the same surface as the anode and cathode regions.

With a co-location of the anode and cathode regions on the same surface, it is possible to form the cathode region so it extends in a closed loop around the anode region, thereby laterally enclosing the anode region. To separate the anode region from the surrounding ring of the cathode region, a potential barrier forming region can be arranged in between. In other words, a potential barrier forming region can be provided that extends in a closed loop laterally to enclose the anode region and be laterally enclosed by the cathode region.

In some embodiments, the barrier forming region is composed of a highly doped n-type or p-type semiconductor material of opposite type to the anode region. In other embodiments, the barrier forming region is composed of a gate. The gate comprises a metallic gate contact and an underlying dielectric layer to isolate the gate contact from the light absorbing region.

It may be advantageous to arrange the ground region so that it extends over at least a part of the side surfaces of the device. These are the side surfaces that laterally bound the device extending between the upper and lower surfaces. Indeed, it is possible to design the device so that the ground region does not occupy any of the upper (or lower) surface, but is tucked under (over) the cathode region, the latter extending to reach the upper (lower) rim of the side surfaces. Namely, the cathode region can extend laterally in the upper (lower) surface to intersect with the side surfaces and the ground region can extend around the side surfaces underneath (above) the cathode region. This allows for a smaller detector area, which can be significant for arrays.

In some embodiments, the anode and cathode regions are co-located on the same surface, i.e. the upper or lower surface, and the ground region extends over the other of the upper and lower surface as well as around the side surfaces. With this approach, the ground region can extend in a continuum around the intersection between said other of the upper and lower surfaces and the side surfaces, i.e. in a bucket-like shape. Alternatively, the ground region portion on the side surface may be separate from the ground region portion on the upper/lower surface. Namely, the ground region may comprise a side portion extending over a vertical part of the side surfaces and a base portion extending over said other of the upper and lower surfaces, the side and base portions being separated by a portion of the light absorbing region which laterally extends to the side surfaces.

According to a further aspect of the disclosure there is provided a method of operating a photodetector device to detect absorption of single photons. The method comprises:

resetting the device by applying a bias voltage between the anode and cathode regions to reverse bias the junction formed between them and to create a depletion region in the light absorbing region adjacent the anode region;

setting the device for photon sensing by switching the bias voltage from reverse bias to forward bias; and sensing absorption of a single photon in the light absorbing region through the photon absorption generating an electron-hole pair and through one of the electron or hole being induced by the forward bias to drift towards and arrive at the depletion region, where its associated charge erodes the depletion region sufficiently to induce a current to start to flow between the anode and cathode regions.

According to another aspect of the disclosure there is provided a method of operating a photodetector device to detect absorption of a photon flux. The method comprises:

resetting the device by applying a bias voltage between the anode and cathode regions to reverse bias the junction formed between them and to create a depletion region in the light absorbing region adjacent the anode region;

setting the device for photon sensing by switching the bias voltage from reverse bias to forward bias; and sensing when a threshold number of photons having been absorbed in the light absorbing region through each photon absorption generating an electron-hole pair, and through one of the electron or hole being induced by the forward bias to drift towards and arrive at the depletion region, where its associated charge erodes the depletion region and thereby causes an increase in the current between the anode and ground regions, and such that a threshold number of said carriers arriving at the depletion region is sufficient to induce a further current to start to flow between the anode and cathode regions.

According to another aspect of the disclosure there is provided a method of manufacturing a photodetector device as described above.

According to another aspect of the disclosure there is provided a photosensor array having a planar construction with upper and lower surfaces, the photosensor array comprising:

a layer of light absorbing region of doped semiconductor material configured to generate pairs of oppositely charged carriers in response to absorption of photons;

an array of detector pixels each having respective anode and cathode regions co-located at one of the upper and lower surfaces as well as side surfaces that subdivide the light absorbing region into the detector pixels;

a plurality of insulating trenches, which may be filled with dielectric material, extending over the side surfaces of the pixels to at least partially electrically isolate the pixels from each other;

anode and cathode contacts embedded in the respective anode and cathode regions of each said pixel on said one of the light absorbing layer's upper and lower surfaces; and at least one ground contact connected to the pixels' ground regions, wherein each pixel's anode region is composed of a highly doped p-type or n-type semiconductor material and arranged in contact with the light absorbing region;

wherein each pixel's cathode region is composed of a highly doped n-type or p-type semiconductor material of opposite type to the anode region and arranged in contact with the light absorbing region;

wherein the ground region for each pixel is composed of a highly doped p-type or n-type semiconductor material of the same types as the anode region and arranged in contact with the light absorbing region;

wherein the anode, cathode and ground regions are arranged in relation to each other and the light absorbing region such that for each pixel, when a pixel is switched from reverse bias to forward bias for sensing, a depletion region is created in the light absorbing region adjacent the anode region, and current flows between the anode and ground regions, and, when a pixel is switched from reverse bias to forward bias for sensing, a carrier of appropriate positive or negative charge type generated in the light absorbing region in response to photon absorption will be induced by the forward bias to drift towards the depletion region, the device being configured such that in response to each said carrier reaching the depletion region its associated charge causes the current between the anode and ground regions to increase, and such that a threshold number of said carriers arriving at the depletion region is sufficient to induce a further current to start to flow between the anode and cathode regions.

According to another aspect of the disclosure there is provided a photosensor array comprising:

a plurality of photodetector devices as described above;

a plurality of insulating trenches, e.g. forming a mesh, extending vertically between the photodetector devices from said one of the upper and lower surfaces towards the other of the upper and lower surfaces to at least partially electrically isolate the pixels from each other;

anode and cathode contacts embedded in the respective anode and cathode regions of each said pixel on said one of the light absorbing layer's surfaces; and at least one ground contact connected to the pixels' ground regions.

The trenches may be completely filled with insulating material. Another option is for the trenches of insulating material to have metallic material embedded in the dielectric material such that the metallic material is isolated from the ground regions (and other electrically active regions) of the pixels.

There are various options for contacting the ground regions of the pixels. These options include: having a single ground contact arranged to commonly contact all the ground regions; having a plurality of pixel-specific ground contacts for respective ones of the pixels; and having a plurality of pixel-group-specific ground contacts, each commonly contacting an adjacent group of the pixels, e.g. a group defined by m×n pixels.

In some array embodiments, in each pixel the cathode region extends to its associated trenches. This is suitable for a design with no ground contact at the top of the array, but rather ground contacting from underneath.

In some array embodiments, for each pixel, said regions are concentrically arranged in plan view such that from outside inwards the regions are ordered: cathode region, barrier forming region and anode region, and wherein the barrier forming region has an aspect ratio of at least 1.5 with a major axis and a minor axis, the major axis extending diagonally in relation to the alignment of the two-dimensional array of pixels, and the barrier forming region having a cut-away portion on one side along its minor axis to accommodate an enlarged area of the cathode region around the cathode contact. With this design, each pixel may include a further cathode contact embedded in the cathode region such that the barrier forming region lies between the cathode contact and the further cathode contact, and wherein the barrier forming region has a further cut-away portion on its other side along its minor axis to accommodate a further enlarged area of the cathode region around the further cathode contact. Moreover, a separator region may additionally be provided that is oppositely doped to the cathode region and arranged such that from outside inwards said regions are ordered: cathode region, separator region, barrier forming region and anode region.

According to another aspect of the disclosure there is provided a method of manufacturing a photosensor array as described above.

A chip that accommodates the proposed photodetector array can be incorporated into a module with other chips fabricated in different wafers using different processes. The modules may be based on front or back illumination, i.e. the additional chip(s) may be attached either to the front (upper) side of the sensor array chip for back illumination, or the back (lower) side of the sensor array chip for front illumination.

To this end, a still further aspect of the disclosure provides an integrated sensor array module comprising: a photosensor array as described formed as a first chip from a first wafer; and a processor device formed as a second chip from a second wafer, wherein the processor chip comprises an array of pixel-specific processing elements for the pixels of the sensor chip, the processor chip being mounted on the sensor chip so that vias form electrical connections between each of the pixel-specific processing elements of the processor chip and pixel contacts of corresponding pixels in the photosensor array. Such an integrated sensor array module may further comprise: a memory device formed as a third chip from a third wafer, the memory chip comprising pixel-specific memory elements for the pixels of the sensor chip, the memory chip being mounted on the processor chip so that further vias form electrical connections between each of the pixel-specific processing elements of the processor chip and the pixel-specific memory elements in the memory chip.

The photodetector or photodetector array can be integrated with, or provided in a common module with, a pulsed laser source, such as a VCSEL, to provide a TOF sensor device.

An integrated photodetector array module may be provided that comprises a first chip with a photodetector array device as described above mounted together with a processor device formed as a second chip. The respective chips may then be manufactured independently on separate wafers using respective materials and fabrication processes optimized to each. The processor chip comprises an array of pixel-specific processing elements for the pixels of the sensor chip. The processor chip is mounted on the sensor chip. Vias between the two chips form electrical connections between each of the pixel-specific processing elements of the processor chip and pixel contacts of corresponding pixels in the photodetector array device. The integration is thus vertical with one-to-one correspondence between the pixels of the photodetector array and processing elements in the processor chip. The integration may be taken a step further by also attaching a memory chip to the module. The memory device is formed as a third chip from a third wafer and comprises pixel-specific memory elements for the pixels of the sensor chip. The memory chip is mounted on the processor chip so that further vias form electrical connections between each of the pixel-specific processing elements of the processor chip and the pixel-specific memory elements in the memory chip. The memory may be a random access memory, such as a DRAM, for example.

According to further aspects of the disclosure there are provided methods of manufacturing a photodetector device or photodetector array as described above.

BRIEF DESCRIPTION OF THE DRAWINGS

In the following, the present invention will further be described by way of example only with reference to exemplary embodiments illustrated in the figures.

DETAILED DESCRIPTION

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Figure 1A:
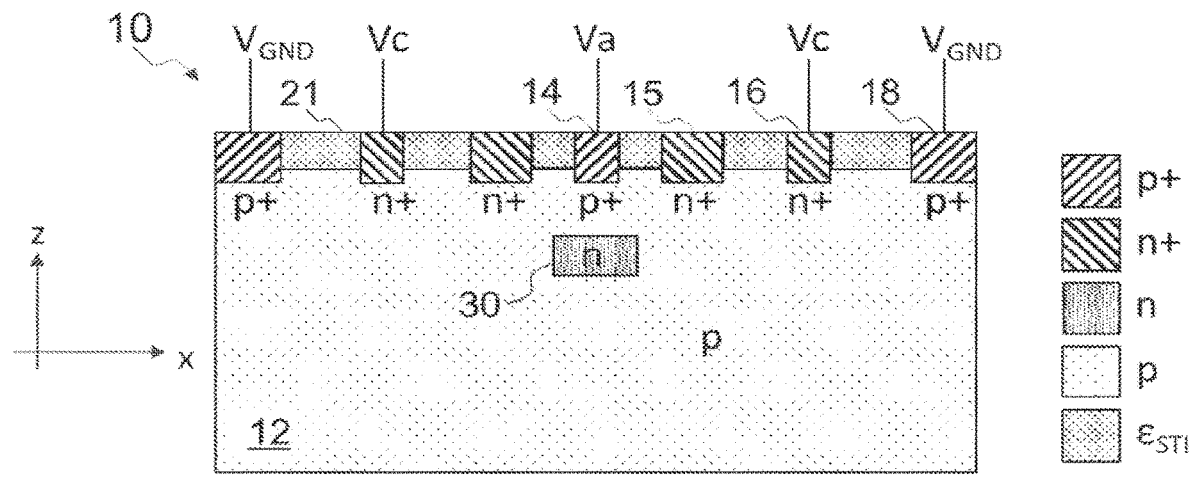
FIG. 1A is a schematic cross-section in the xz-plane of a photodetector according to a first embodiment.
Figure 1B:
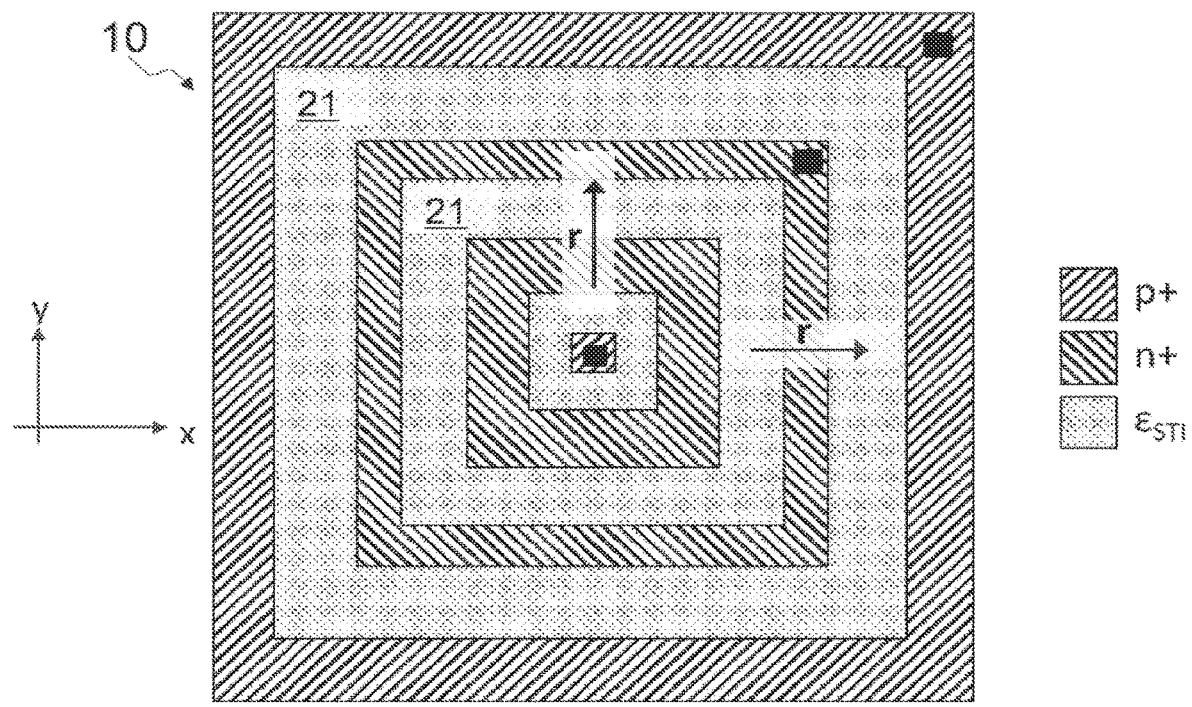
FIG. 1B is a schematic plan view in the xy-plane of the photodetector of FIG. 1A.

FIG. 1A is a schematic cross-section in the xz-plane of a photodetector 10 according to a first embodiment. FIG. 1B is a schematic plan view in the xy-plane of the photodetector 10.

The photodetector 10 is based on a p-type layer 12 of semiconductor material which in use absorbs photons for detection. The p-type layer 12 may be formed from a substrate and/or an epitaxial layer deposited on a substrate. Various regions are formed on the top surface of the substrate 12. Namely, a centrally arranged anode region 14 is formed of p+ material. The anode region 14 is surrounded by a ring of n+ material 15 that has the role of forming a depletion region around the anode 14. The depletion region around the anode 14 is formed by the barrier forming region 15 when the anode-cathode regions 14, 16 are reverse biased (see below). The n+ barrier forming region 15 is floating and serves to create a potential barrier around the oppositely doped p+ anode region 14.

A cathode region 16 of n+ material is formed around the barrier forming region 15 and a ground region 18 of p+ material is formed around the cathode region 16 which serves to pin the voltage around the cathode close to ground. The light absorbing layer 12 thus forms a pn-junction between the anode and cathode regions 14, 16. The light absorbing layer 12 is configured to generate pairs of oppositely charged carriers, i.e. electrons 'e⁻' and holes 'h⁺', in response to absorption of photons 'hv' when light is incident on the device. In FIG. 1B, the radial or distal direction away from the central anode region 14 is indicated with the arrows "r". Each contact is separated by dielectric material 21, which may be formed by shallow trench isolation, for example in a CMOS process. Respective contacts for the anode, cathode and ground which are schematically shown by black blobs in FIG. 1B are provided with a suitable metal or metallic compound such as a silicide. These allow bonding of leads or via connections to apply the anode, cathode and ground voltages Va, Vc and $V_{GND}$ respectively.

The highly doped semiconductor material labelled as p+ or n+ may be doped sufficiently highly to be degenerate, i.e. so that the doping centers merge into a miniband allowing electrons or holes to move without needing to transfer into the adjacent conduction or valence band respectively, or may be doped at a lower level than the threshold for degenerate doping, but nevertheless significantly higher than the doping concentrations in the light absorbing region.

The first embodiment includes an island 30 of doped semiconductor material contained within the light absorbing layer 12 adjacent to the anode region, wherein the island 30 is oppositely doped to the semiconductor material of the light absorbing layer. In the present embodiment, we have an n-type island in a p-type light absorbing layer. Such an island is arranged so that it lies within the depletion region formed around the anode when the device is reset. The island thus provides a charge sink within the depletion region. As a variant to a single island, multiple such islands may be provided, which may be coplanar, i.e. occupy a common xy-plane, or vertically offset and so lying in different xy-planes.

A variant of the first embodiment would have the same cross-section as shown in FIG. 1A, but with the anode, cathode and ground regions arranged in extended lines in the y direction, rather than in rings around a point-like anode contact as shown in FIG. 1B.

It is noted that, for the first embodiment, and also for all the other embodiments described herein, there is an equivalent 'mirrored' embodiment in which the doping senses of all the semiconductor layers or regions are reversed p-to-n, n-to-p etc.

Figure 2A:
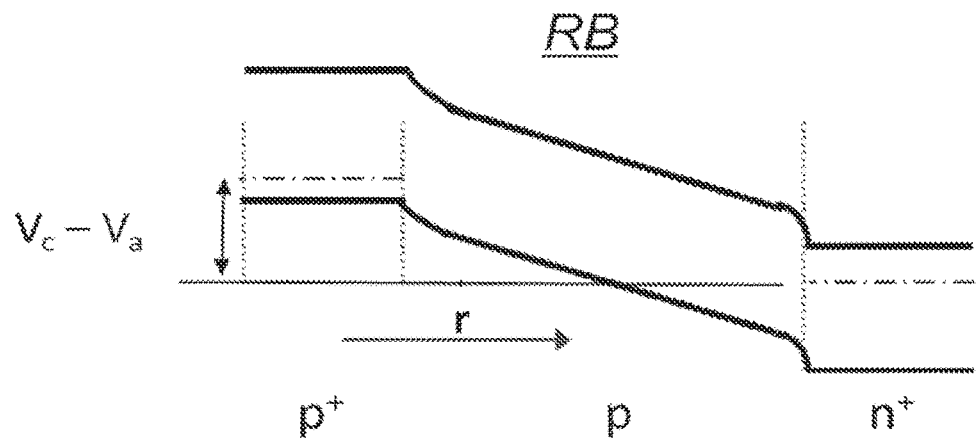
FIGS. 2A, 2B, and 2C are energy band diagrams showing a photodetector of the first embodiment with the photodetector respectively in a reversed-biased state, in a forward-biased non-conducting state and in a forward-biased conducting state.
Figure 2B:
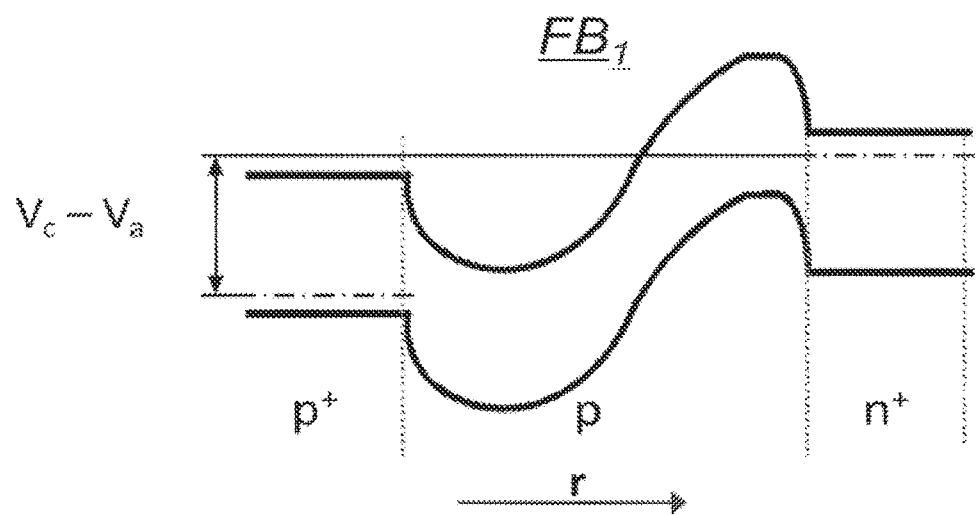
Figure 2C:
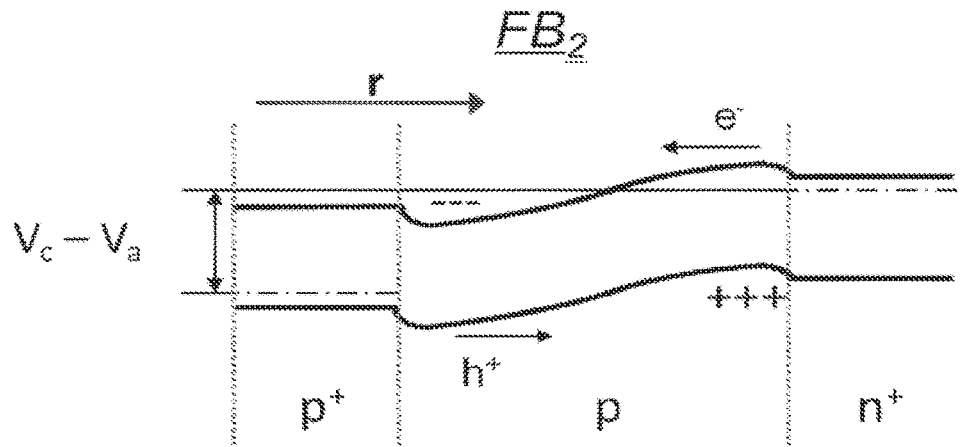

FIGS. 2A, 2B, and 2C are energy band diagrams showing a photodetector according to the embodiment of FIG. 1 with the photodetector respectively in a reversed-biased state (FIG. 2A), in a forward-biased non-conducting state (FIG. 2B) and in a forward-biased conducting state (FIG. 2C). A reset in reverse bias (RB), i.e. the state shown in FIG. 2A can be produced, by way of example, by setting:

$Va=1$ V $Vc=1.8$ V and $V_{GND}=0$ V where Va is the anode voltage, Vc is the cathode voltage and $V_{GND}$ is the ground voltage. The forward bias (FB) sensing mode of FIGS. 2B and 2C can be produced, by way of example, by setting:

$Va=1$ V $Vc=0.2$ V and $V_{GND}=0$ V

With these example voltage values, the switch from RB to FB consists only of changing one voltage, namely the cathode voltage Vc. Alternatively, the switching can also be caused by changing the anode voltage at the same time as the cathode voltage, but this introduces additional complexity, e.g. in terms of the drive circuit overhead need to initiate and coordinate the two voltage changes. In an integrated system with a detector array of multiple pixels, a requirement to switch two voltages rather than one may also give rise to the need for two vias per pixel instead of one between the detector chip layer and an adjacent detection circuit layer.

Figure 3:
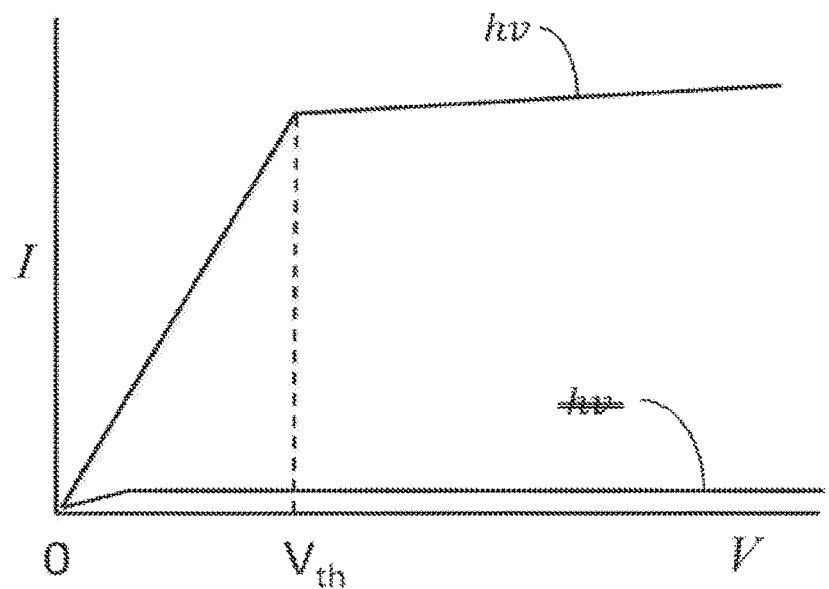
FIG. 3 is a graph of output current as a function of bias voltage for the photodetector of the first embodiment with and without incident light, i.e. the forward-biased conducting and non-conducting states of FIGS. 2C and 2B respectively.

FIG. 3 is a graph of output current as a function of bias voltage for the photodetector according to the first embodiment with and without incident light, i.e. the forward-biased conducting and non-conducting states of FIGS. 2C and 2B respectively. The photodetector is structured and configured so that absorption of a single photon creates an electron-hole pair in the absorption region 12, and the electron initiates the photocurrent, whereas the hole has no effect and is merely taken up by the ground or cathode.

Operation for single-photon detection is now described. When the device is reset by applying a reverse bias (FIG. 2A), i.e. the cathode 16 is held at a greater voltage than the anode 14, a depletion region is created in the p-type light absorbing layer 12 around the region 15. Any carriers generated in the light absorbing layer will be removed into the anode, cathode and ground contacts. The reverse bias causes the depletion region to extend to encompass the anode region 14. The depletion region thus acts as a barrier for holes, so no current can flow through anode. A potential barrier, which is preferably as high as possible, is created everywhere around the anode. When the device is then switched to a forward bias for sensing, i.e. the cathode 16 is held at a lower voltage than the anode 14 (FIG. 2B). Notwithstanding the switch to forward bias, the junction between cathode and the light absorbing layer 12 initially stays reverse biased, because the anode is isolated by the depletion region and the light absorbing layer 12 is connected to ground through ground region 18. When a single photon is absorbed by the substrate 12 an electron-hole pair is created. The single electron is captured by the cathode 16 or ground 18 with no functional effect. The single hole however migrates towards the anode 14 and is captured by the depletion region. This erodes the depletion region formed around the region 15 sufficiently to expose at least a part of the anode 14 so that it becomes electrically connected to the light absorbing layer 12. As a result, anode-generated current starts to flow between anode and cathode from hole injection from the anode. The anode-generated current switches the cathode-substrate junction from RB to FB. In turn, the change of the cathode-substrate junction to forward bias initiates the flow of cathode-generated current between anode and cathode from electron injection from the cathode. The positive feedback leads to an abrupt growth in the current between anode and cathode. Finally, the potential barriers that existed immediately after the RB-to-FB switch completely disappear and the current in the device will be a forward current of the p-n junction. Current thus increases very rapidly after the single photon absorption from the dark current level to the light level shown schematically in FIG. 3.

The same overall structure is also capable of operating as a conventional DPD where trigger time is a measure of incident photon intensity. In this case, the device is configured to be less sensitive than for single-photon detection and require absorption of a high number of photons before the charge sink constituted by the depletion region approaches saturation and current starts to flow between anode and cathode.

Figure 4:
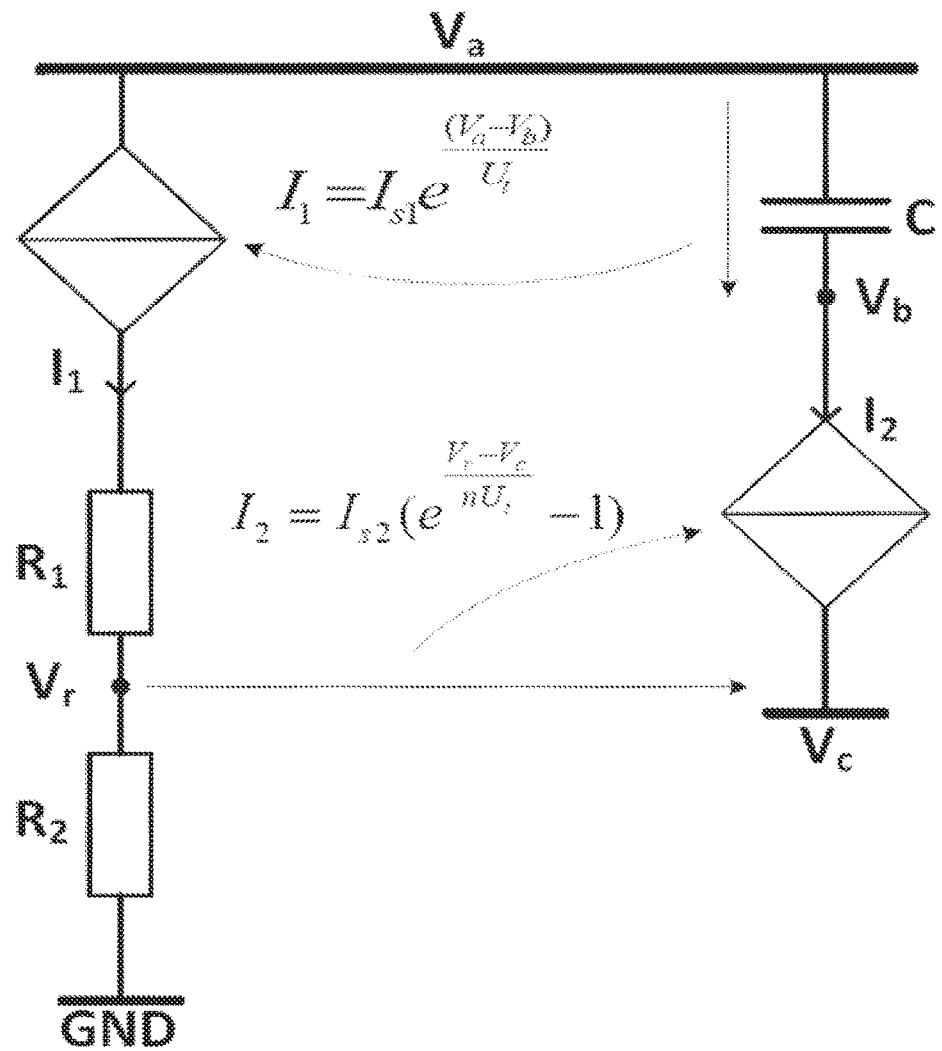
FIG. 4 is an equivalent circuit of the photodetector of the first embodiment.

FIG. 4 is an equivalent circuit of the photodetector of the first embodiment which we refer to in order to discuss operation for single-photon detection proceeds as follows. A single electron from a single photon absorption charges the capacitor C and therefore increments the voltage Vb by an amount ΔVb. In order that the device is sensitive enough to be able to sense a single photon, it is necessary that the voltage increase ΔVb causes a big enough increase in the anode-generated current I1 to cause Vr to be pulled up in a short time from its reset value near ground to above Vc, so that the cathode-generated current I2 is initiated. To achieve this sensitivity, three equivalent circuit parameters can be manipulated:

- C: since V=Q/C, if C is kept small then the incremental voltage change ΔVb resulting from a single electron charge is high.
- R2>>R1: This ensures nearly all the voltage from anode to ground is dropped from cathode-to-ground and very little is dropped over the anode-to-cathode, resulting in Vr being as big as it can be in relation to Va.
- maximize R1+R2: This ensures that the voltage drop for a given anode-generated current I1 is as big as possible, so that the switch in the inequality Vr<Vc to Vr>Vc takes place in the shortest amount of time with a minimum current change.

All three design parameters therefore collectively ensure that the switch in the inequality Vr<Vc to Vr>Vc (i.e. the reverse to forward bias switch of the cathode-substrate pn-junction) and the onset of the cathode-generated current I2 takes place with the least amount of absorbed photons.

Features included in various embodiments of the disclosure that contribute to reducing the capacitance C include the following:

- doped islands 30
- thinned anode region 15 (see FIG. 12)
- buried doping.

For single-photon detection, the single electron generated by a single photon absorption needs to cause a large enough effect in terms of shrinking the depletion region to expose the anode enough so that the "usual" DPD two-stage cascade effect occurs, i.e. a big increase in the anode-generated current I1 which switches the cathode-substrate junction from RB to FB which in turn results in the onset of the cathode-generated current I2.

Figure 5A:
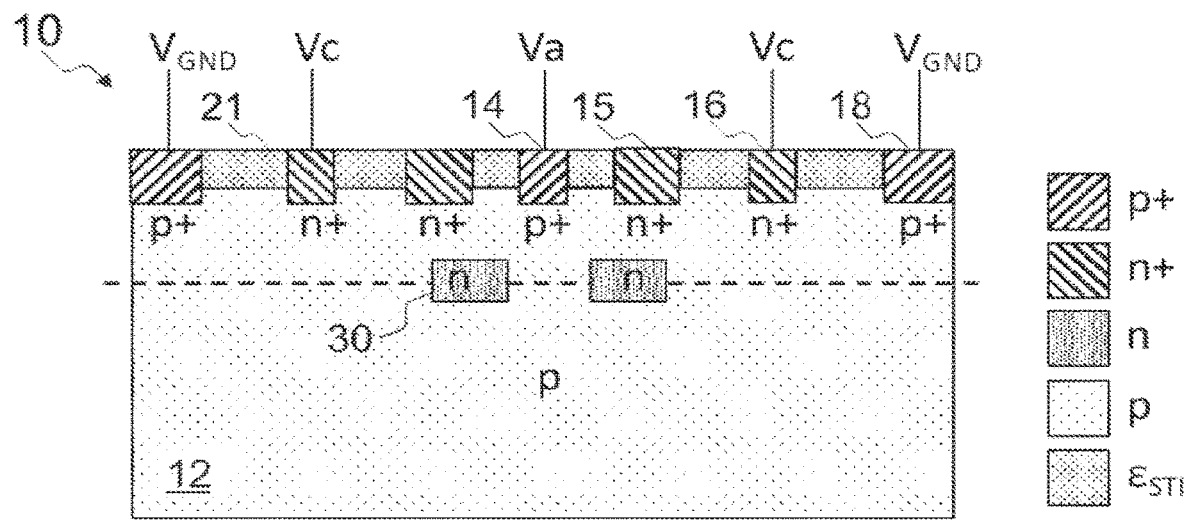
FIG. 5A is a schematic cross-section in the xz-plane of a photodetector according to a second embodiment.
Figure 5B:
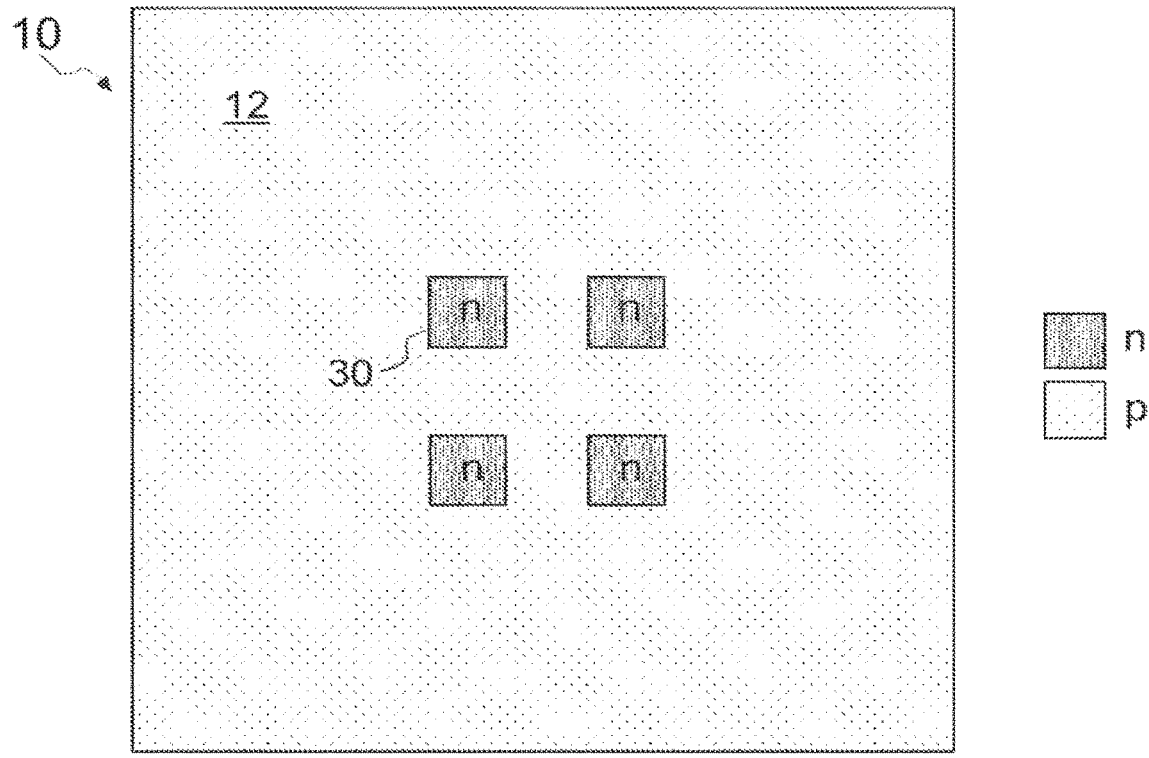
FIG. 5B is a schematic section view in the xy-plane of the photodetector of FIG. 5A with the section taken through the n-type islands as shown by the dashed line in FIG. 5A.

FIG. 5A is a schematic cross-section in the xz-plane of a photodetector according to a second embodiment. FIG. 5B is a schematic section view in the xy-plane of the photodetector of FIG. 5A with the section taken through the n-type islands 30 as shown by the dashed line in FIG. 5A. The second embodiment is the same as the first embodiment except for the additional provision of at least one island 30 of doped semiconductor material that is oppositely doped to the semiconductor material of the doped light absorbing layer 12 within which it is contained. In the illustrated example there are four islands and they are doped n-type arranged to occupy respective areas underneath the dielectric material 21 that separates the central anode 14 from the surrounding depletion region forming region 15. The islands 30 provide a charge sink within the depletion region that is formed when a reverse bias voltage is applied between the anode and cathode contacts 14, 16 as described above.

Inclusion of an electron-charging island 30 in the p-type absorption layer 12 creates a higher potential barrier drop close to the island compared to the uniform barrier drop created in the embodiment without an island in which the floating n+ material 15 forms a doped ring, leading to a higher increase in the anode-to-ground current.

Figure 6:
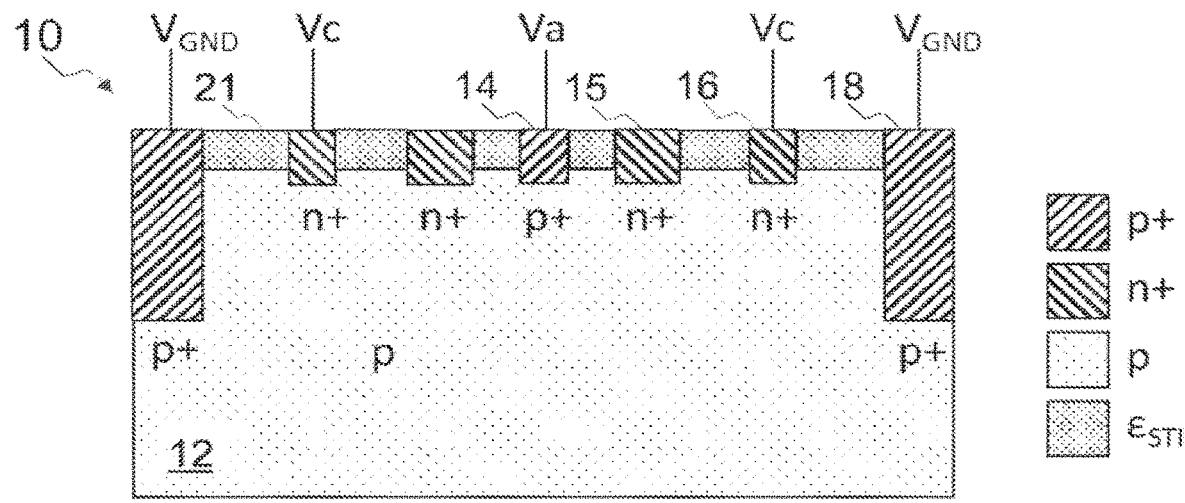
FIG. 6 is a schematic cross-section in the xz-plane of a photodetector according to a third embodiment.

FIG. 6 is a schematic cross-section in the xz-plane of a photodetector according to a fourth embodiment. The fourth embodiment is the same as the first embodiment except that the ground contact 18 is extended from the upper surface part way down the sidewalls of the detector. This helps to reduce the crosstalk between pixels, if this detector design is used for an array. This also helps to improve collection of carriers generated by photon absorption at the floating n+ region 15.

In the embodiment of FIG. 6, the same sets of voltages as stated above in relation to FIGS. 2A, 2B, and 2C may be applied to put the device in RB and FB.

Figure 7:
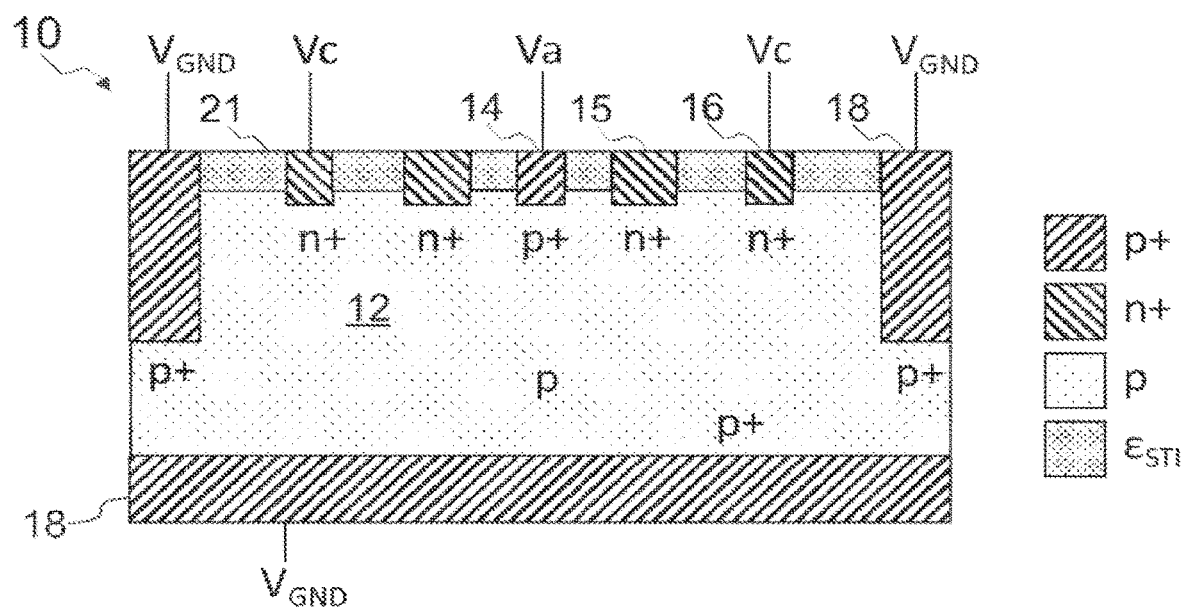
FIG. 7 is a schematic cross-section in the xz-plane of a photodetector according to a fourth embodiment.

FIG. 7 is a schematic cross-section in the xz-plane of a photodetector according to a fifth embodiment. The fifth embodiment is the same as the fourth embodiment except that additional p+ material is arranged on the base of the light absorbing layer (lower surface of the substrate) 12 to form an additional part of the ground contact 18. This helps to further reduce crosstalk and to further improve carrier collection.

In the embodiment of FIG. 7, the same sets of voltages as stated above in relation to FIGS. 2A, 2B, and 2C may be applied to put the device in RB and FB.

Figure 8:
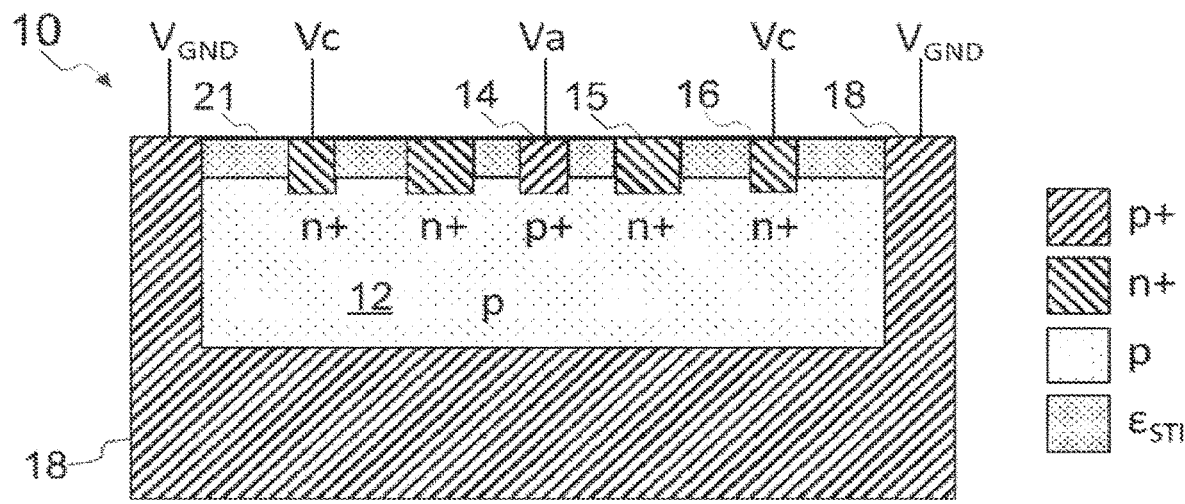
FIG. 8 is a schematic cross-section in the xz-plane of a photodetector according to a fifth embodiment.

FIG. 8 is a schematic cross-section in the xz-plane of a photodetector according to a sixth embodiment. The sixth embodiment is the same as the fifth embodiment except that the separate ground contact regions 18 down the sidewalls and over the base are merged into a single continuous region extending from the device top surface down the sidewalls and around the bottom surface. This provides better pixel isolation to reduce crosstalk, if this detector design is used for an array.

In the embodiment of FIG. 8, the same sets of voltages as stated above in relation to FIGS. 2A, 2B, and 2C may be applied to put the device in RB and FB.

Figure 9:
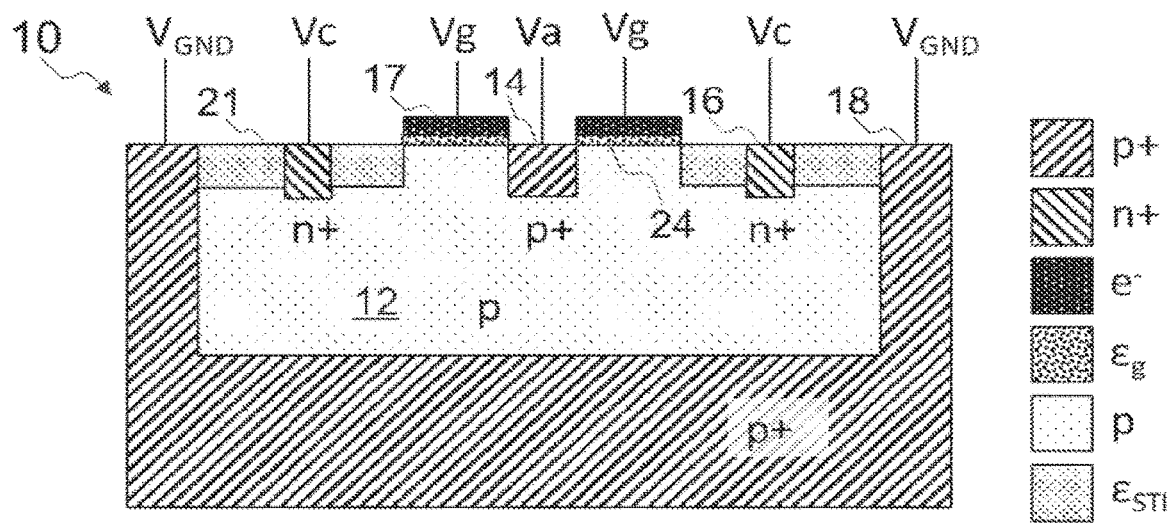
FIG. 9 is a schematic cross-section in the xz-plane of a photodetector according to a sixth embodiment.

FIG. 9 is a schematic cross-section in the xz-plane of a photodetector according to a seventh embodiment. Compared to the previous embodiments, it can be seen that the depletion-region forming n+ region 15 has been replaced by a gate comprising a metal or metallic gate area 17 and an underlying dielectric layer 24 to separate the gate area from the underlying p-type semiconductor material of the light absorbing layer 12. Use of a gate instead of a floating, highly doped semiconductor region to assist formation of the depletion region around the anode has the advantage that by changing the applied gate voltage we can control the magnitude of the voltage barrier and the physical extent of the depletion region around the anode. The depletion region is formed during when a positive voltage is applied to the gate.

In the embodiment of FIG. 9, by way of example only the following sets of voltages can be applied to the anode, gate, cathode to put the device in RB and FB:

| RB: | Va = 1 V | Vc = 1.8 V | Vg = 0 V | $V_{GND}$ = 0 V |
|---|---|---|---|---|
| FB: | Va = 1 V | Vc = 0.2 V | Vg = 1.8 V | $V_{GND}$ = 0 V |

Figure 10:
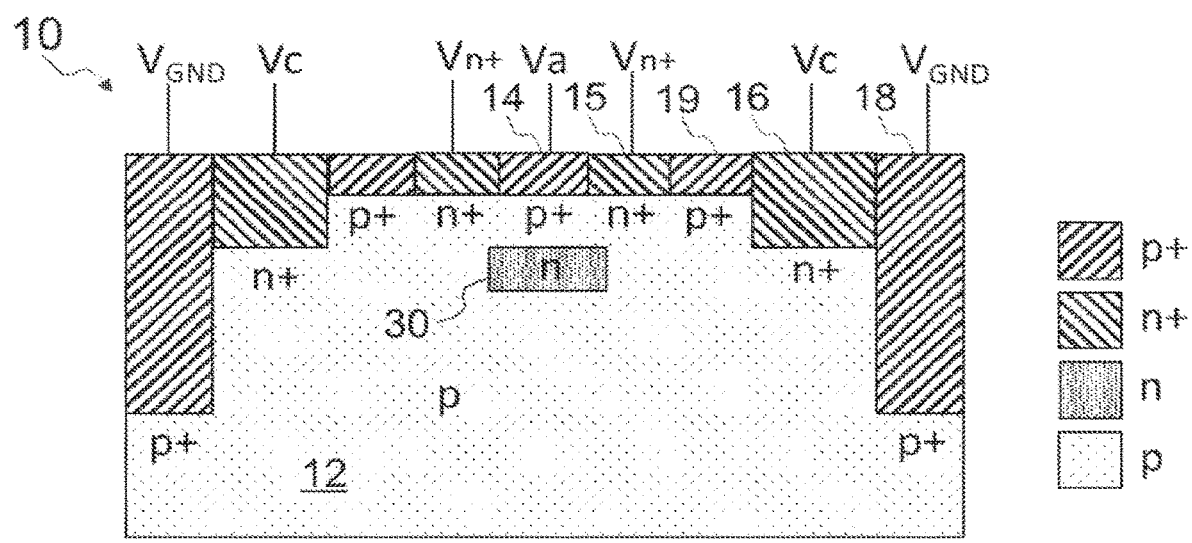
FIG. 10 is a schematic cross-section in the xz-plane of a photodetector according to a seventh embodiment.

FIG. 10 is a schematic cross-section in the xz-plane of a photodetector according to an eighth embodiment. In the previous embodiments, insulating material 21, e.g. from the CMOS STI processing, separates the various degeneratively doped functional regions on the upper surface, i.e. anode region 14, cathode region 15, barrier forming region 16 and ground region 18. In the embodiment of FIG. 10, there is no such insulating material, rather the different degeneratively doped regions on the upper surface laterally abut each other. In the case that adjacent functional regions are oppositely doped abutting contact can be accepted, e.g. the n+ cathode region can abut the p+ ground region. However, referring to previous embodiments which include an n+ barrier forming region 15, we see this is laterally adjacent to the n+ cathode region, so they need to be electrically isolated from each other, i.e. cannot abut. To solve this problem, in the embodiment of FIG. 10, an additional p+ region is provided to separate the barrier forming region 15 and the n+ cathode region 19 allowing a design without dielectric material for separating the different functional regions on the device upper surface. In the embodiment of FIG. 10, an oppositely-doped island 30 under the anode is also provided similar to the first embodiment.

In the embodiment of FIG. 10, by way of example the following sets of voltages can be applied to the anode, gate, cathode to put the device in RB and FB:

| RB: | Va = 1 V | Vc = 1.8 V | Vn+ = 1.8 V | $V_{GND}$ = 0 V |
|---|---|---|---|---|
| FB: | Va = 1 V | Vc = 0.2 V | Vn+ = 1 V | $V_{GND}$ = 0 V |
| or |
| RB: | Va = −1 V | Vc = 0.2 V | Vn+ = 1 V | $V_{GND}$ = 0 V |
| FB: | Va = 1 V | Vc = 0.2 V | Vn+ = 1 V | $V_{GND}$ = 0 V |

In this embodiment the floating n-type island region 30 is buried, and the n+ regions on the surface are contacted and used for reset.

It is noted that as schematically illustrated in the above embodiments, the detectors may have an aspect ratio of less than unity as defined by the depth of the light absorbing layer 12 being greater than its width. Generally, the thickness of the light absorbing layer 12 will be dictated by the physics, i.e. absorption length of photons of the desired wavelength range in the semiconductor material used for the light absorbing layer. For detection in the visible range with silicon as the semiconductor material, the thickness of the light absorption region will be perhaps 2-5 micrometers.

Figure 11A:
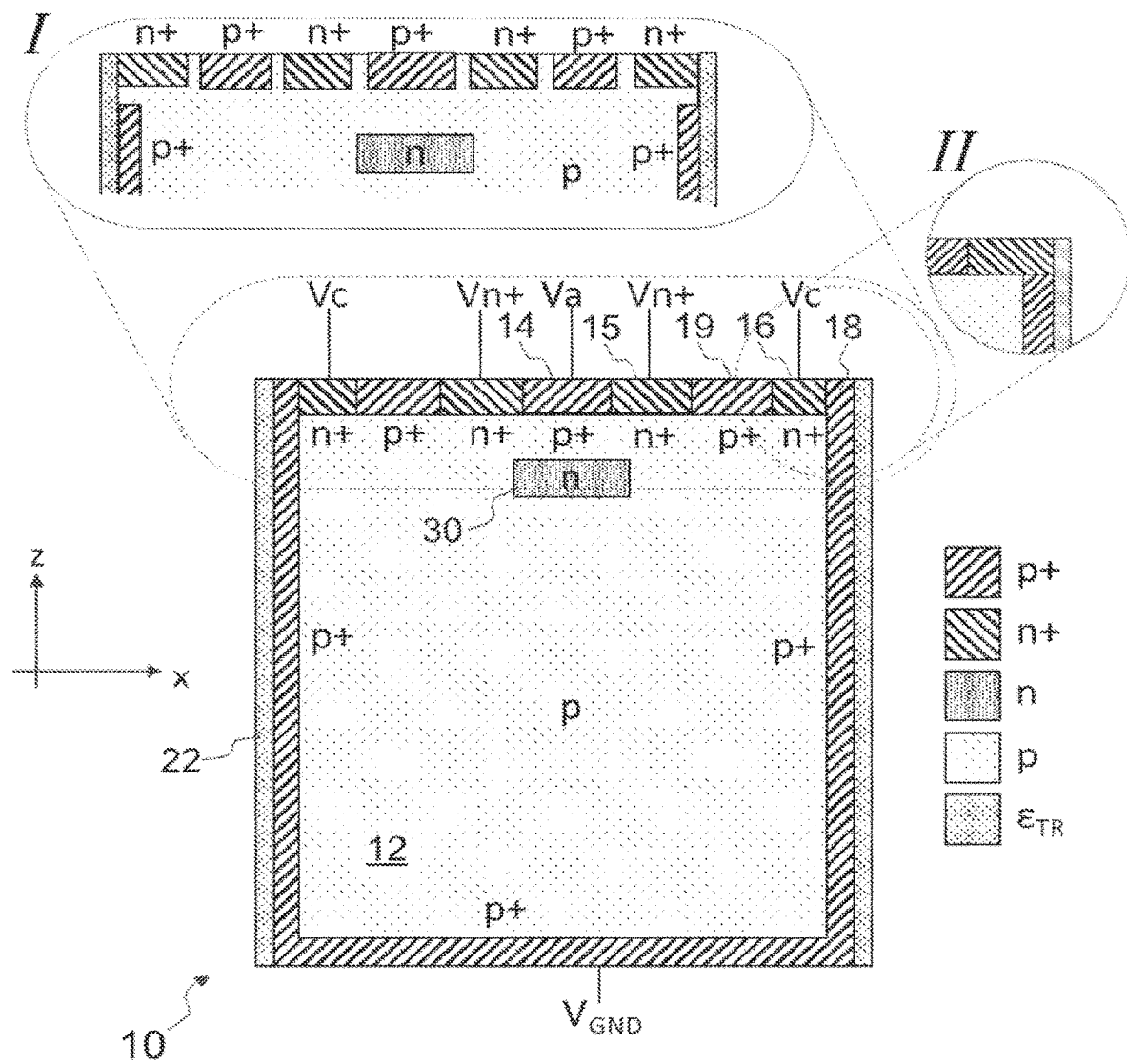
FIG. 11A is a schematic cross-section in the xz-plane of a sensing pixel of a photodetector array together with two variants (shown in Insets I and II) according to a first photodetector array embodiment.

FIG. 11A is a schematic cross-section in the xz-plane of a sensing pixel of a photodetector array together with two variants shown inset according to a first photodetector array embodiment.

Similar to the embodiment of FIG. 10, the main FIG. 11A shows a design in which the various highly doped regions on the top surfaces abutting each other without use of intervening insulating material. Outwards from the anode region, the highly doped regions on the top surface alternate between p+ and n+. Radially outwards from the anode region, the regions on the top surface are: p+ anode region 14; n+ barrier forming region 15; p+ separator region 19; n+ cathode region 16; p+ ground region 18; and dielectric trench region 18. The ground region 18 extends over the full height of the sidewalls of the light absorbing layer 12 from the top surface to the bottom surface so that the p-type material of the light absorbing layer 12 is not in direct contact with the dielectric material of the trenches 22. The ground region 18 further extends in a continuum from the sidewalls over the bottom surface of the light absorbing layer so that the ground region 18 can be contacted from below. The ground region 18 thus has a bucket-like or box-like form wrapping around all but the top surface of the light absorbing layer, with the other highly doped regions 14, 15, 19 and 16, being like a lid.

Having the ground contact extending over the sidewalls helps reduce dark current. By dark current, we mean the current generated inside the device due to various mechanisms other than photon absorption. The lateral surfaces of the semiconductor material, i.e. the sidewalls, have a comparatively high density of defects compared with inside the volume of the semiconductor material, and these defects act as a source of dark current. Since the ground contact is highly doped, it will conduct away the carriers generated by these surface defects so that they do not enter the light absorbing layer and generate dark current. Moreover, by wrapping the sidewalls, and preferably also the base, in the ground contact, pixel isolation is improved, i.e. optical and electrical crosstalk between pixels is reduced. Furthermore, the two effects of thermal generation of carriers and loss of carriers through interband recombination can be matched, so that these two effects cancel each other out.

Operation may proceed as follows. When the device is reset by applying a reverse bias, i.e. the cathode contact is held at a greater voltage than the anode contact, a depletion region is created in the p-type light absorbing layer adjacent the anode region. When the device is then switched to a forward bias for sensing, i.e. the cathode contact is held at a lower voltage than the anode contact, the depletion region acts as a charge sink for capturing holes that have migrated towards the anode region. Namely, a hole generated as part of an electron-hole pair in the light absorbing layer in response to a photon absorption drifts to the depletion region and causes it to shrink. Once a threshold number of holes have drifted towards the anode region and are thus captured in the depletion region, the charge sinking effect of the depletion region approaches saturation, the anode region becomes exposed, i.e. starts itself acting as a sink for holes, and current will start to flow between the anode and cathode contacts. In a conventional DPD operational mode, the threshold number of holes needed to cause onset of current flow between the anode and cathode is very large, and so the amount of time between the RB-to-FB switch and the onset of current flow is inversely proportional to the incident light intensity, which can be measured with a time-to-digital converter. In a single photon detecting or counting operational mode, the threshold number of holes is one, so that absorption of a single photon and the consequent capture of a single hole in the depletion region is sufficient to cause the onset of anode-to-cathode current flow, which can be measured with a counter.

In the embodiment of FIG. 11A (including variants), the following sets of voltages may be applied to the anode, gate, cathode to put the device in RB and FB:

| RB: | Va = 1 V | Vc = 1.8 V | Vn+ = 1.8 V | $V_{GND}$ = 0 V |
|---|---|---|---|---|
| FB: | Va = 1 V | Vc = 0.2 V | Vn+ = 1.0 V | $V_{GND}$ = 0 V |

With this mode of operation, switching from reset to sensing, i.e. switching from RB to FB, requires both Vc and Vn+ to be changed, i.e. requires two voltage levels to be adjusted. An advantageous alternative that may be used with the embodiment of FIG. 11A (including variants) only needs one voltage to be changed as follows:

| RB: | Va = −1 V | Vc = 0.2 V | Vn+ = 1.0 V | $V_{GND}$ = 0 V |
|---|---|---|---|---|
| FB: | Va = 1 V | Vc = 0.2 V | Vn+ = 1.0 V | $V_{GND}$ = 0 V |

The requirement to only change one voltage is particularly beneficial for detector arrays and/or in high speed operation, since there are no time synchronization requirements for the drive signals. An example of where this may be significantly advantageous is for photon counting in a detector array (as opposed to single photon detection), since in photon counting each pixel is run asynchronously and reset each time a single photon is detected, with each trigger being counted as one photon by a pixel-specific counter, such as a shift register that forms the front-end of a signal processing chip that may be directly bonded to the sensor array chip as discussed further below with reference to FIG. 15.

FIG. 11A Inset I shows a variant in which the various highly doped regions 14, 15, 19, 16 and 18 are adjacent to each other but not abutting, but rather separated by some of the p-type material of the light absorbing layer 12. In addition, an independent design difference lies in that the ground region 18 does not extend to the top surface. Rather the cathode region 16 extends radially outwards to the edge of the semiconductor material, i.e. to the top of the sidewalls, where it abuts the dielectric material of the trenches 22. Viewed in plan view, i.e. along the negative-z direction from above, the ground region 18 is underneath the cathode region 16 with their radially outward-facing surfaces being aligned. Tucking the ground region 18 underneath the cathode region 16 in this way allows each detector to be smaller in its xy-plane extent which is useful for making more compact detector arrays.

FIG. 11A Inset II shows a variant which is essentially the same as Inset I except that the various highly doped regions 14, 15, 19, 16 and 18 abut each other. Like Inset I, in Inset II, the ground region 18 is arranged underneath the cathode region 16.

Further variants of the design of FIG. 11A could be contemplated, e.g. similar to Inset I but with STI-formed dielectric material separating one or more of the highly doped regions on the top surface. Use of STI dielectric would also allow the separator region 19 to be omitted if desired.

Figure 11B:
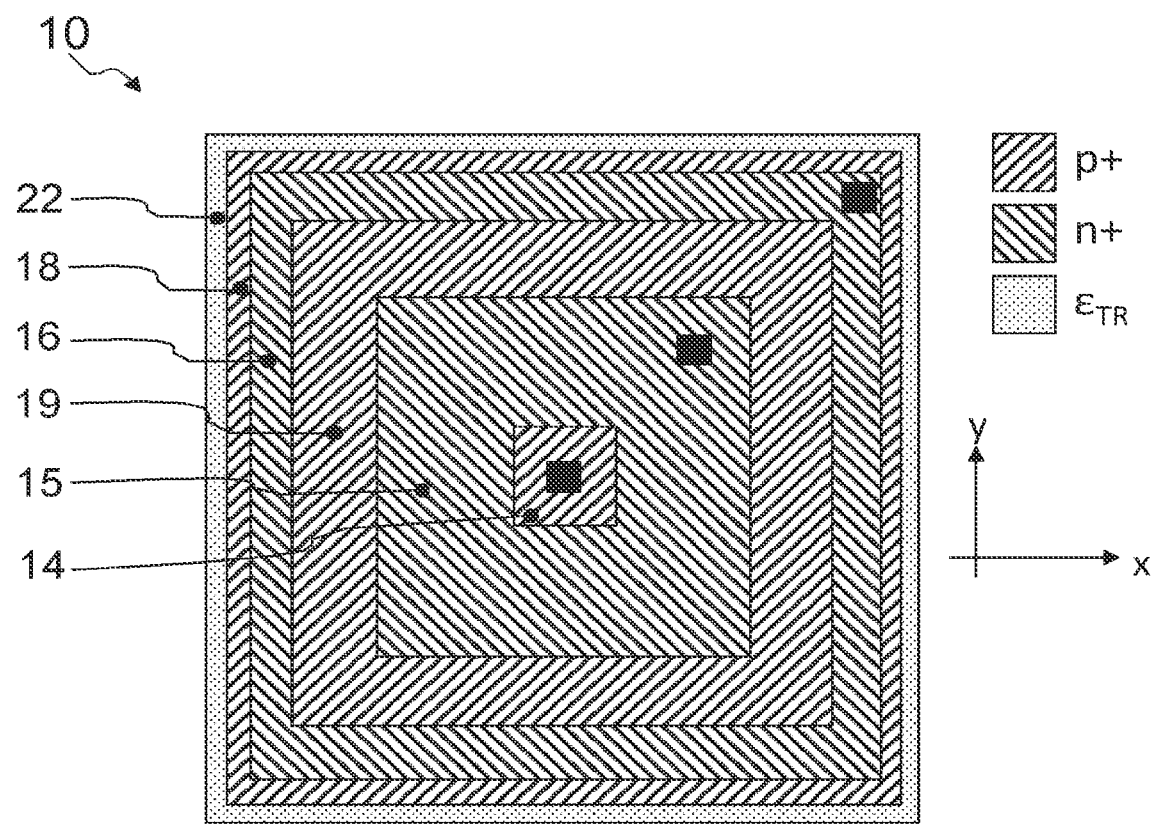
FIG. 11B is a schematic plan view in the xy-plane of the photodetector array sensing pixel of FIG. 11A.

FIG. 11B is a schematic plan view in the xy-plane of the photodetector array sensing pixel of FIG. 11A. The three black squares indicate example locations for the metal contact pads for the anode, cathode and depletion-region forming connection wires to form suitable electrical connections to the anode, cathode and barrier forming regions.

Figure 12:
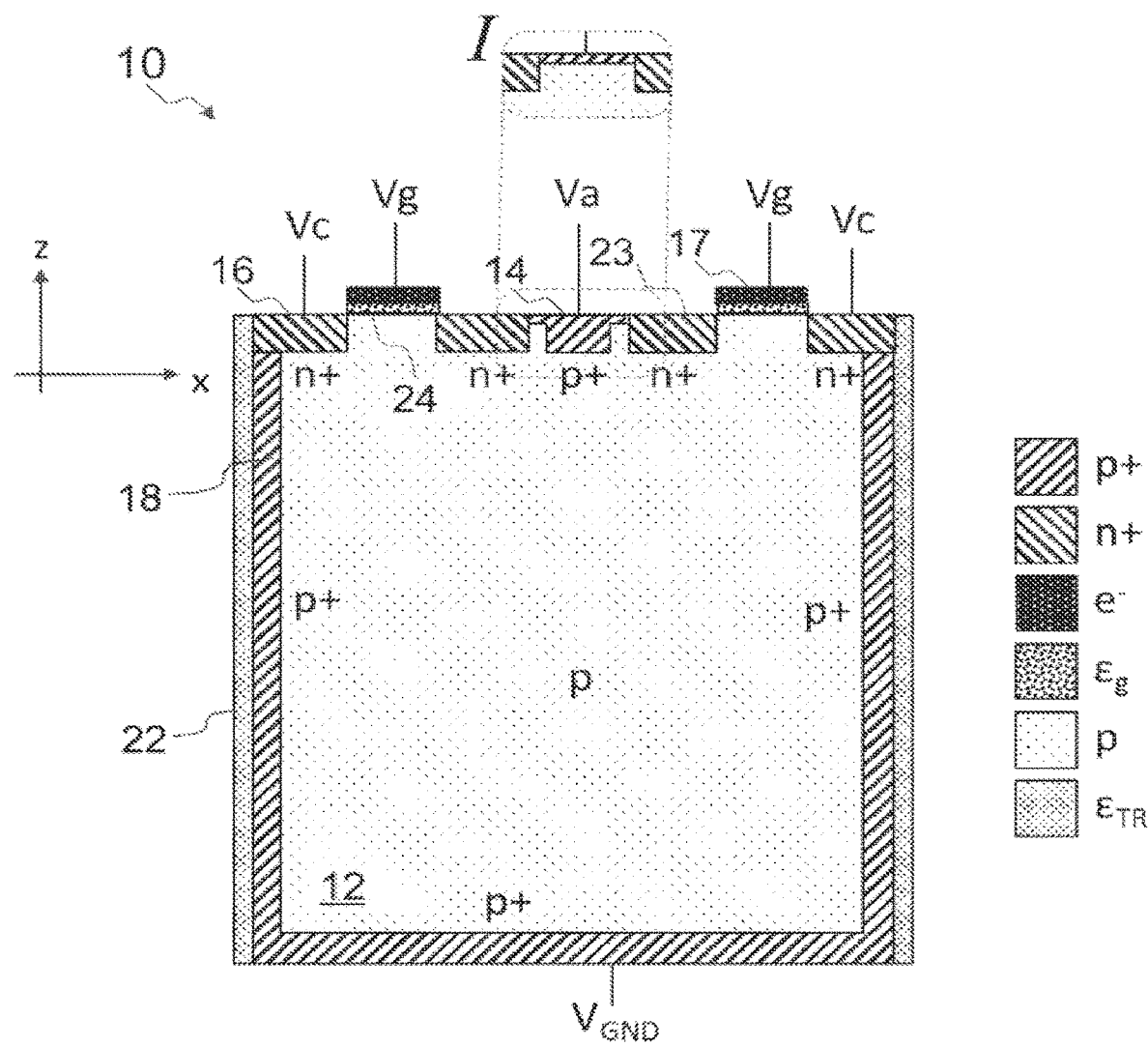
FIG. 12 is a schematic cross-section in the xz-plane of a sensing pixel of a photodetector array according to a second photodetector array embodiment.

FIG. 12 is a schematic cross-section in the xz-plane of a sensing pixel of a photodetector array according to a second photodetector array embodiment. An alternative variant for the anode region 14 is shown with Inset I. The gate comprises a metal or metallic gate area 17 and an underlying dielectric layer 24 to separate the gate area from the p-type semiconductor material of the light absorbing layer 12. The depletion region is formed by an n+ region 23. The following sets of voltages may be applied to the anode, gate, cathode to put the device in RB and FB:

| RB: | $V_a = 1$ V | $V_c = 1.8$ V | $V_g = 1.8$ V | $V_{GND} = 0$ V |
| FB: | $V_a = 1$ V | $V_c = 0.2$ V | $V_g = -1$ V | $V_{GND} = 0$ V |

To reduce the capacitance between the floating n+ region 23 and the anode region 14, as discussed above with reference to the equivalent circuit of FIG. 4, the anode region 14 is thinned. The anode can either be thinned over its whole area as shown in Inset I, or thinned only at its laterally outward (i.e. distal) edges as shown in the main figure. The thinning may be expressed in terms of thickness, i.e. vertical dimension, compared to one or more of the other highly doped regions, e.g. the cathode region. It is noted that the anode region thinning, while disclosed in a design that uses gates for creating the depletion region, may also be used in the other embodiments disclosed herein that do not use gates for generating the depletion region.

In a variant of the FIG. 12 embodiment, the gate can be left floating. Use of a floating gate instead of a floating highly doped semiconductor region (as in the first embodiment) still has an advantage in that the surface quality of the semiconductor material under the gate will in general be better than when STI surface or native oxide is at the surface, so dark current can be kept lower. Referring to the sets of voltages stated above, this variant may be operated with the above-stated anode, cathode and ground voltages.

In a further variant of the FIG. 12 embodiment (not shown), a higher concentration of p-type doping could be provided in the p-type region 12 locally underneath the gate dielectric 24, i.e. between the cathode and separator regions 16 and 23. This helps to reduce the dark current.

Figure 13A:
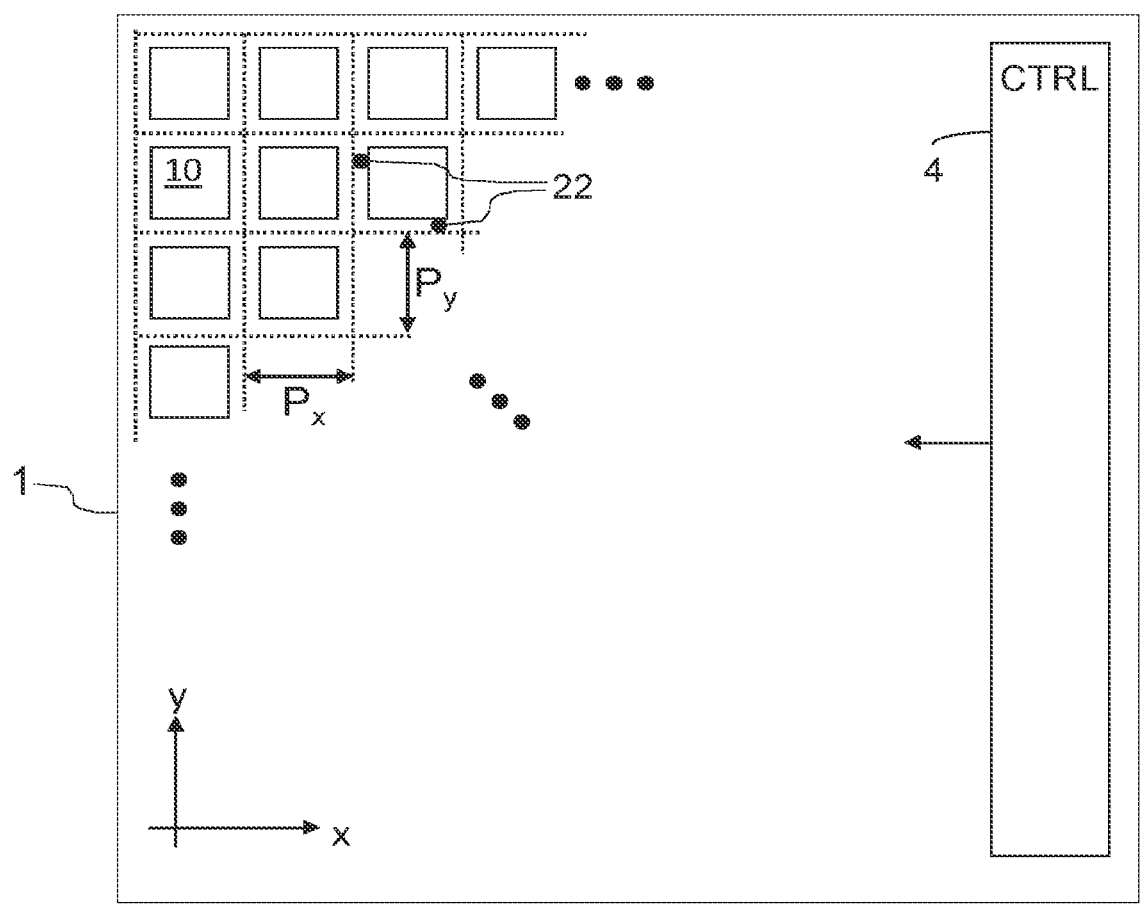
FIG. 13A is a schematic plan view in the xy-plane of a photodetector array according to various embodiments.
Figure 13B:
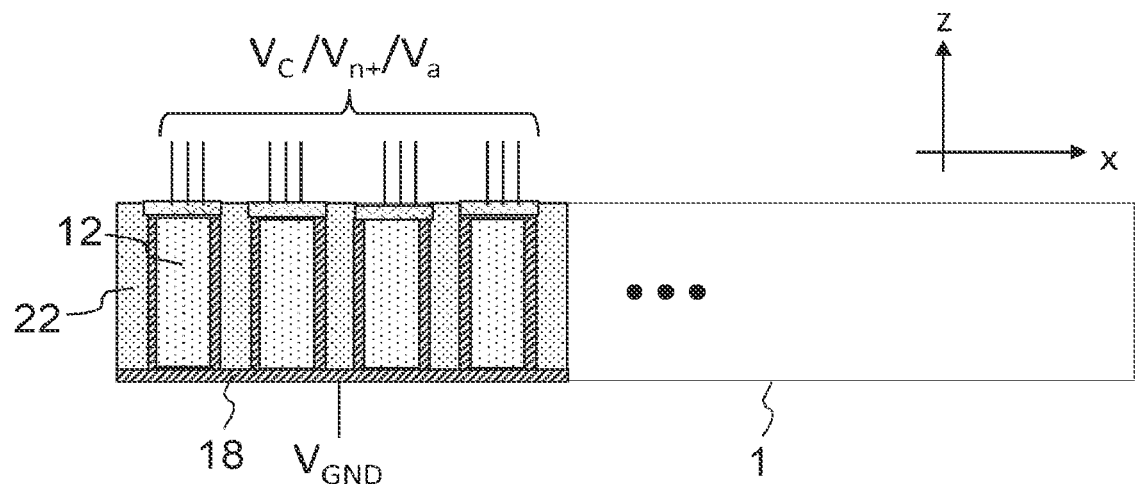
FIG. 13B is a schematic cross-section in the xz-plane of the photodetector array of FIG. 13A in which the sensing pixels follow the design of FIGS. 11A & 11B.

FIG. 13A is a schematic plan view of a sensor array device 1 and shows that the sensing pixels, each formed of a single-photon detector 10 as described above, are arranged in a two-dimensional (2D) array with pixel pitches Px and Py in the x and y directions respectively. (Other embodiments may have a one-dimensional pixel array.) FIG. 13B is a schematic cross-section in the xz-plane of the photodetector array of FIG. 13A in which the sensing pixels follow the design of FIGS. 11A & 11B. The pitches of the 2D array Px, Py may be equal to form a square array or they may be different to form a rectangular array. Each pixel 10 is formed by principally by a column of the photon absorbing semiconductor material 12 plus its doped regions 14, 15, 16, 18, 19, 30, the column being electrically isolated from its neighbors by dielectric, i.e. electrically insulating, material formed as trenches 22 between the semiconductor material 12. The semiconductor material columns thus have sidewalls which are adjacent the dielectric material of the trenches 22. There is thus provided a two-dimensional array of laterally adjacent, independently contactable photodetectors 10. The sensor array device 1 may also have areas for control or other electronics components 4 formed in the same wafer as schematically illustrated in FIG. 13A. The layers of the photodetector may be epitaxially fabricated on a p-type substrate, for example. The trenches 22 form a mesh of dielectric material extending vertically through the upper surface of the light absorbing layer 12 either completely through to the lower surface of the light absorbing layer 12, or part way down. A common ground layer can be used to commonly contact all the pixels in the array in which case the dielectric trenches will terminate above the common ground contact. On the other hand, each pixel could be independently grounded and the dielectric trenches could extend right through the structure. In other array embodiments, the ground could be contacted from above as shown for example in the first embodiment and several of the later embodiments.

Figure 13C:
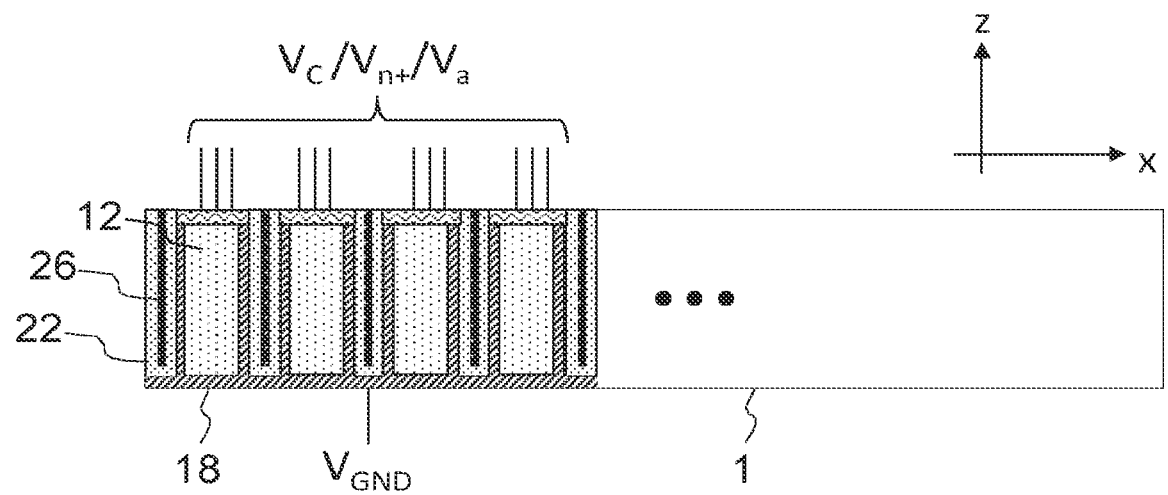
FIG. 13C is a schematic cross-section in the xz-plane of the photodetector array of FIG. 13A in which the sensing pixels largely follow the design of FIGS. 11A & 11B but include metal trenches embedded within the dielectric trenches.

FIG. 13C is a schematic cross-section in the xz-plane of the photodetector array of FIG. 13A in which the sensing pixels largely follow the design of FIGS. 11A & 11B but include metal trenches 26 within the dielectric interpixel trenches 22. Embedding metal in the dielectric trenches is useful to reduce optical cross-talk between pixels. In particular, any photon that would otherwise enter the light absorbing layer through the sidewall will be absorbed by the metal.

The DPD array structure is subdivided into individual pixels, in a two-dimensional array of rows and columns (or alternatively a one-dimensional array of rows) by insulating trenches filled with dielectric material that electrically isolate adjacent pixels from each other. The dielectric material may be material that is deposited after etching, or material that is generated by an oxidization process after etching, for example. Instead of filling the trenches with dielectric material, they could be left unfilled or only be partly filled by a thin layer of oxide or other insulating material coating the sides of the trenches. The insulating trenches thus extend vertically through the light absorbing layer so as to subdivide the photodetector structure into an array of pixels that are independently contactable. As shown in FIG. 13C, it is also possible to insert metal or metallic material in the dielectric trenches. Moreover, as mentioned above for the individual detectors, also for the DPD arrays, each pixel may have an aspect ratio of greater than or less than unity.

Figure 14A:
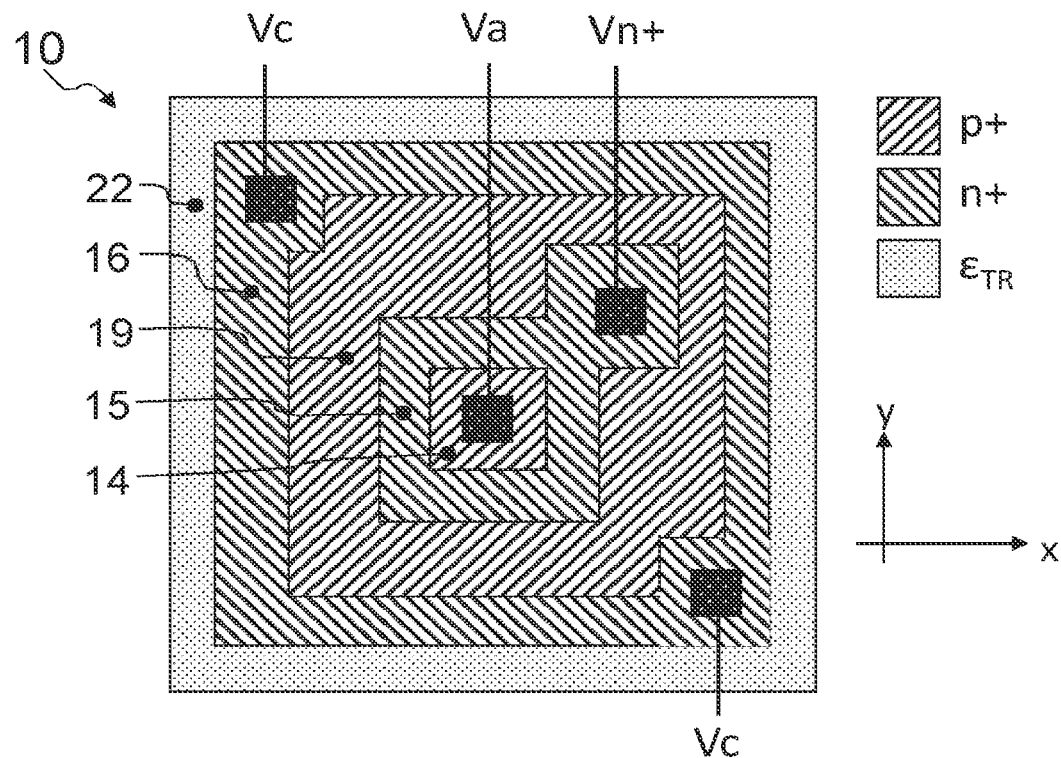
FIG. 14A is a schematic plan view of a sensing pixel based on the design of FIG. 11A Inset II with a design of the top contacts optimized for small area.

FIG. 14A is a schematic plan view of a sensing pixel based on the design of FIG. 11A Inset II with a design of the top contacts optimized for small area. Referring back to FIG. 11B, we see that the respective highly doped regions 15, 19, 16, 18 arranged concentrically around the centrally positioned anode region 14 are square-shaped (or rectangular-shaped) with a uniform width. However, for fabrication reasons, whichever design rules apply to the process being used will specify a minimum size for the contact pads. If it is desired to shrink the lateral dimensions of the detector pixel as shown in FIG. 14A, there will be a point when the contact pad areas cannot be shrunk anymore and so can no longer be accommodated as shown in FIG. 11B. To allow the other features to be shrunk beyond this limit and nevertheless accommodate the contact pads in the cathode region 16, the cathode region is laterally enlarged compared with its general width locally around the contact pad. In the case of FIG. 14A, we see there are two cathode contact pads arranged in diagonally opposite corners of the square pixel, each with a locally enlarged area. In other embodiments, there may be only one cathode contact pad, but the provision of two helps reduce the contact resistance. The enlarged corners of the cathode region then encroach diagonally inwards towards the anode region. In turn, the regions that are radially inside the cathode region need to be adjusted accordingly to accommodate the locally enlarged cathode regions. This is done by cutting away area from the regions 19 and 15 along the diagonal so that both the barrier forming region 15 and the separator region 19 have a waisted elongate shape along the other diagonal of the pixel reminiscent of a peanut or snowman. These elongate regions may be described by a major axis (along the diagonal opposite the diagonal formed between the cathode contacts) and a minor axis (along the cathode contact diagonal).

Figure 14B:
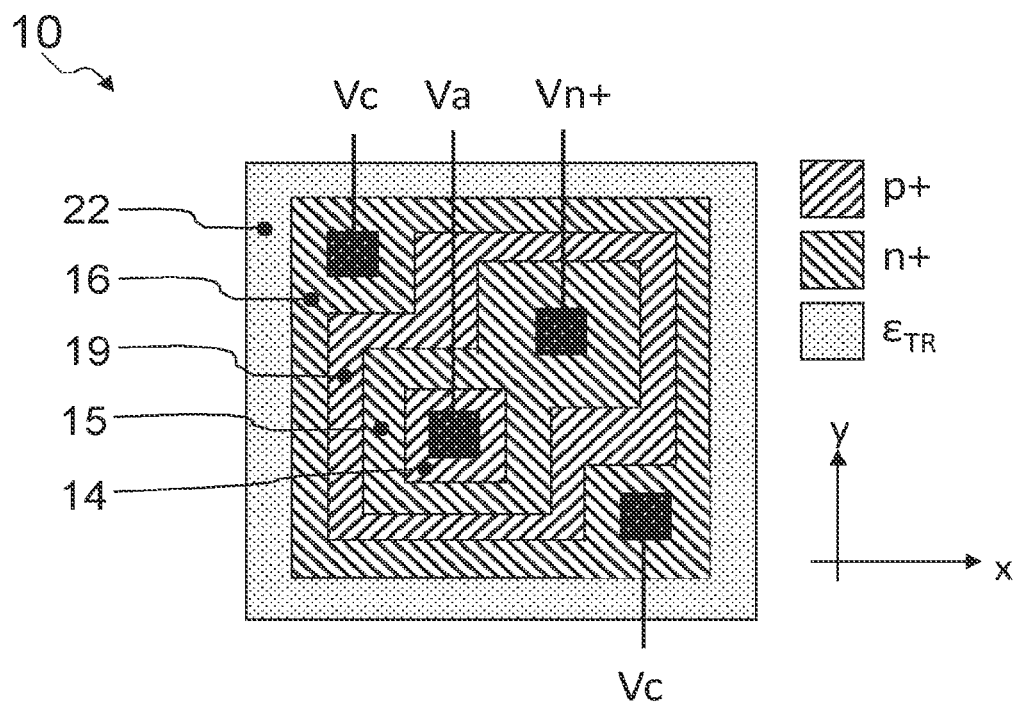
FIG. 14B is a schematic plan view of a sensing pixel based on the design of FIG. 11A Inset II with a design of the top contacts optimized for even small area than FIG. 14A.

FIG. 14B is a schematic plan view of a sensing pixel based on the design of FIG. 11A Inset II with a design of the top contacts optimized for even small area than FIG. 14A. To show the effect of pixel shrinking, although FIGS. 14A and 14B are schematic, we have kept the contact pad areas the same (square black blobs). Here we see by comparing FIG. 14A with 14B the further shrinking makes the overall changes more pronounced, with the anode also being offset along the pixel diagonal away from the pixel center to accommodate the larger degree of encroachment from the more-grossly expanded corner areas of the cathode region, which have become relatively larger in proportion to the other features to remain large enough to contain the cathode contact pad areas.

Figure 15:
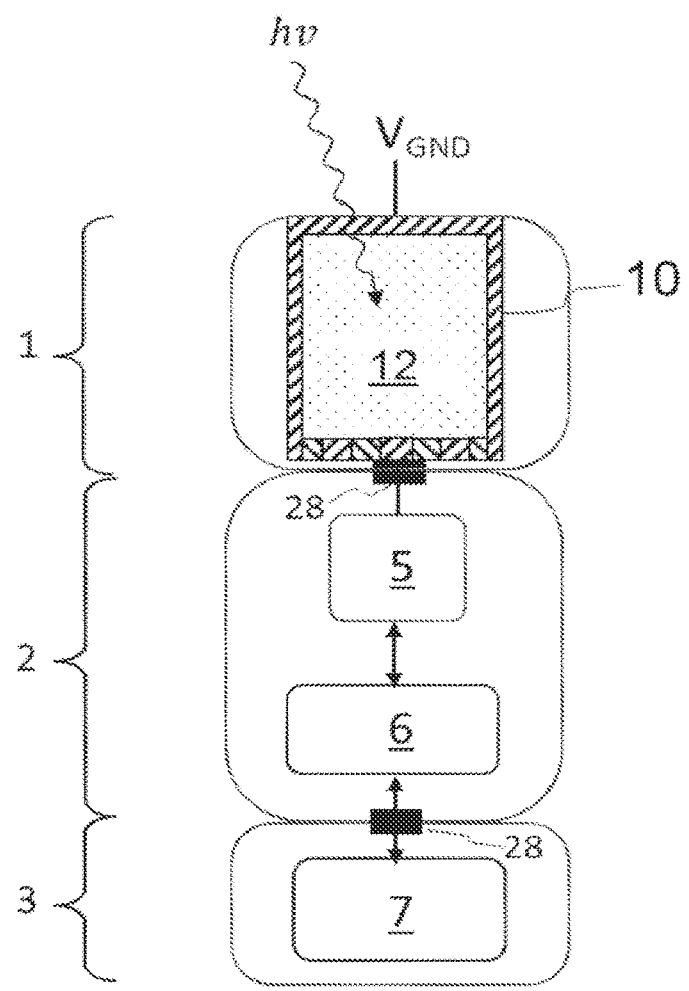
FIG. 15 is a schematic section of an integrated sensor array module incorporating a sensor array device embodying the invention, such as with a pixel design of FIG. 11A Inset I or Inset II.

FIG. 15 is a schematic section of an integrated sensor array module incorporating a sensor array device embodying the invention as one chip, such as the sensor array of the first embodiment or any of the embodiments described herein. The integrated sensor array module comprises a sensor array device as a first chip 1 and an electronics processing device formed as a second chip 2. For illustration purposes, a single DPD according to the embodiment of FIG. 11A is shown. The circuit layer of the processor chip comprises an array of read out sensors for the photodetector's pixel array with the sensor-to-pixel connections being implemented with vias 28. The circuit layer may be CMOS circuit layer which makes it electrical connections to the pixels with through-silicon vias (TSVs) 28. Bias voltages can then be applied to the anode and cathode regions through the TSVs. Moreover, signal current induced by incident light can be detected on a per pixel basis through the TSV connections. The CMOS circuit layer is shown arranged facing the "upper" surface of the sensor array chip, as considered based on the previous figures and the discussion of the sensor's upper and lower surfaces and as schematically shown in FIG. 15. In this arrangement, a base ground contact can be arranged distal the processor chip 2 and the vias between the sensor array chip 1 and processor chip 2 can connect through to the anode, cathode and other regions and optionally gates on the "upper" surface of the sensor chip where drive and sense signals need to be conveyed. The processor chip 2 has respective electronic processing elements for the pixels of the sensor array device 1, such as digital front-end circuitry 5 and optionally time-to-digital converter (TDC) elements 6 (if the DPDs are operated conventionally to measure intensity through trigger time) or other pixel-specific digital signal processing elements, such as counters for photon counting. The processor chip 2 is mounted on the sensor chip 1 so that vias 28 form electrical interconnects between the processing elements of the processor chip and contacts of the respective pixels in the sensor chip 1. The module optionally further comprises a memory device 7 formed as a third chip 3. The memory may be random access memory, such as DRAM, to provide high density storage. The memory chip comprises memory elements, such as DRAM memory elements 7, for the pixels of the sensor array. The memory chip 3 is mounted on the processor chip 2 so that further vias 28 form electrical interconnects between the processing elements of the processor chip 2 and the respective memory elements of the memory chip 3. It is thus possible to integrate multiple dedicated chips each made by fabrication processes and in materials that are optimized for their own respective designs. Namely, the DPD sensor array chip can be fabricated on one wafer using a dedicated optimized process, the electronic circuits for signal processing can be fabricated in another wafer to manufacture numeric processing chips based, for example, on high-performance CMOS processes, and a third wafer can be used to manufacture memory chips using, for example, a dedicated DRAM fabrication process.

Figure 16:
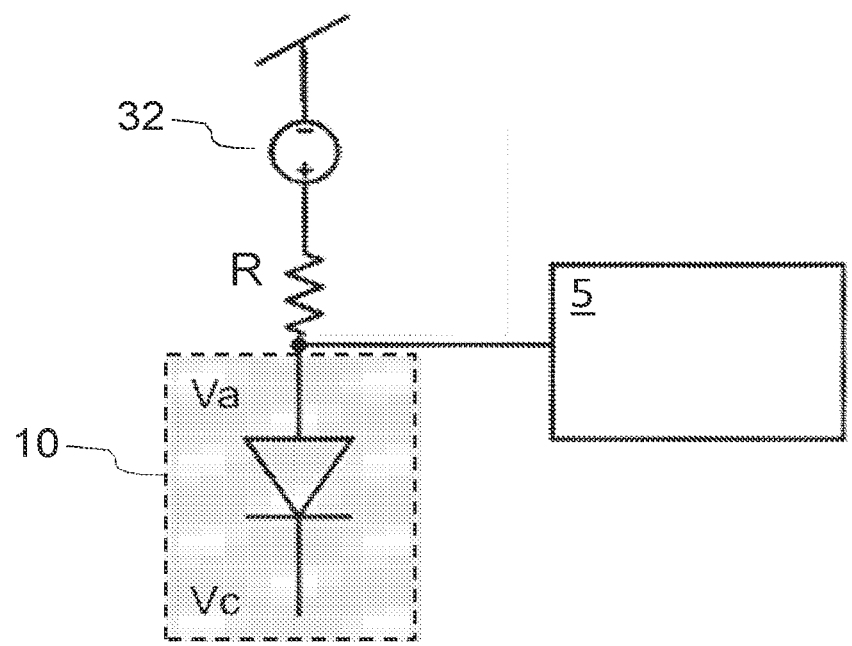
FIG. 16 is an equivalent circuit of a driver for a photodetector or photodetector array based on constant voltage bias.

FIG. 16 is an equivalent circuit of a driver for a photodetector or photodetector array based on constant voltage bias. A digital front-end circuit 5 is connected to each detector (shown schematically as a diode with voltages Va and Vc at the anode and cathode sides) via a constant voltage bias applied by a DC voltage source 25.

Figure 17:
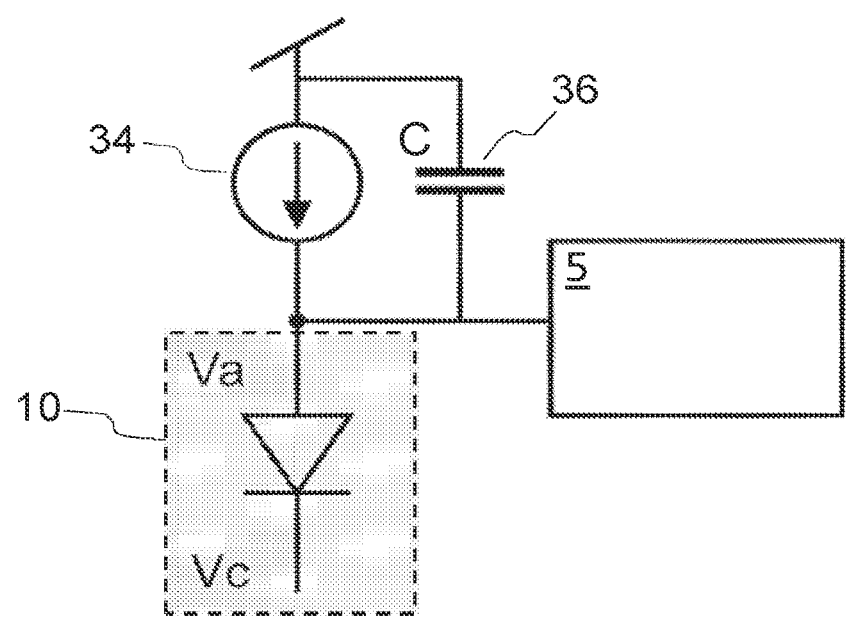
FIG. 17 is an equivalent circuit of a driver for a photodetector or photodetector array based on constant current bias.

FIG. 17 is an equivalent circuit of a driver for a photodetector or photodetector array based on constant current bias. Constant current bias has the advantage that the initial current in the device is independent on the temperature, while in the case of the voltage bias, it will be temperature dependent. Moreover, any small non-uniformities of the bias current applied to different pixels across the array does not cause significant variation in pixel-to-pixel comparative performance, whereas in a conventional DPD operational mode with constant voltage biasing, the trigger time will depend on bias voltage and therefore non-uniform voltage levels from pixel-to-pixel will be a source of error in the measurements. The inclusion of a capacitor in the drive circuit for constant current biasing (see FIG. 17) provides a source of charge to allow for a rapid current increase when a fast change in the barrier height occurs, i.e. when photon sensing triggers.

It will be clear to one skilled in the art that many improvements and modifications can be made to the foregoing exemplary embodiment without departing from the scope of the present disclosure.

REFERENCE NUMERALS

| Reference Numeral | Item |
| --- | --- |
| 1 | photodetector array (chip/device) |
| 2 | CMOS electronics chip |
| 3 | DRAM memory chip |
| 4 | control circuitry/electronics |
| 5 | digital front-end circuitry |
| 6 | time-to-digital converter (TDC) and digital signal processor |
| 7 | DRAM memory |
| 10 | photodetector (pixel) |
| 12 | photon absorption layer (p) - substrate or epitaxial layer |
| 14 | anode region (p+) |
| 15 | barrier forming region (n+) |
| 16 | cathode region (n+) |
| 17 | depletion region forming gate |
| 18 | ground region (p+) |
| 19 | separator region (p+) |
| 21 | dielectric (shallow trench isolation - STI) |
| 22 | dielectric (interpixel trench) |
| 24 | dielectric (gate isolation) |
| 26 | metal interpixel trenches embedded in interpixel dielectric trenches |
| 28 | via |
| 30 | oppositely doped island (n) |
| 32 | DC voltage source |
| 34 | DC current source |
| 36 | current regulating capacitor |

What is claimed is:

1. A photodetector device comprising:
   a light absorbing region of doped semiconductor material bounded by upper, lower and side surfaces, the light absorbing region being configured to generate pairs of oppositely charged carriers in response to photon absorption;
   an anode region composed of a highly doped p-type or n-type semiconductor material and arranged in contact with the light absorbing region;
   a cathode region composed of a highly doped n-type or p-type semiconductor material of opposite type to the anode region and arranged in contact with the light absorbing region;
   a potential barrier forming region composed of a highly doped n-type or p-type semiconductor material of opposite type to the anode region and arranged between the anode region and the cathode region in contact with the light absorbing region; and
   a ground region composed of a highly doped p-type or n-type semiconductor material of the same types as the anode region and arranged in contact with the light absorbing region;
   wherein a depletion region is created in the light absorbing region adjacent the anode region when the device is switched from a reverse bias to a forward bias for sensing, and carriers of appropriate positive or negative charge type generated in the light absorbing region in response to photon absorption are induced by the forward bias to drift towards the depletion region, wherein in response to the carriers reaching the depletion region their associated charges cause a current between the anode and ground regions to increase, such that a threshold number of the carriers arriving at the depletion region is sufficient to induce a further current to start to flow between the anode and cathode regions.

2. The device of claim 1, further comprising at least one island of doped semiconductor material embedded in the light absorbing region adjacent the anode region, wherein the or each island is oppositely doped to the light absorbing region, wherein the or each island is arranged so that it lies within a depletion region that is formed when the device is reset.

3. The device of claim 1, wherein the anode region has a depth at least two times smaller than the depth of the cathode region.

4. The device of claim 1, wherein the cathode region extends in a closed loop laterally to enclose the anode region.

5. The device of claim 4, wherein the potential barrier forming region extends in a closed loop laterally to enclose the anode region and is laterally enclosed by the cathode region.

6. The device of claim 5, wherein the potential barrier forming region is composed of a gate comprising a metallic gate contact and an underlying dielectric layer to isolate the gate contact from the light absorbing region.

7. The device of claim 1, wherein the device is laterally bound by side surfaces and wherein the ground region extends over at least a part of the side surfaces.

8. The device of claim 7, wherein the cathode region extends laterally in the upper surface to intersect with the side surfaces and wherein the ground region extends around the side surfaces underneath the cathode region.

9. The device of claim 1, wherein the anode and cathode regions are co-located on one of the upper and lower surfaces and the ground region extends over the other of the upper and lower surfaces as well as around the side surfaces.

10. The device of claim 9, wherein the ground region extends in a continuum around the intersection between the other of the upper and lower surfaces and the side surfaces.

11. The device of claim 9, wherein the ground region comprises a side portion extending over a vertical part of the side surfaces and a base portion extending over the other of the upper and lower surfaces, the side and base portions being separated by a portion of the light absorbing region which laterally extends to the side surfaces.

12. A photosensor array comprising:
   a layer of light absorbing region of doped semiconductor material configured to generate pairs of oppositely charged carriers in response to absorption of photons;
   an array of detector pixels each having respective anode, cathode, potential barrier forming, and ground regions co-located on a surface of the light absorbing region; and
   a plurality of insulating trenches, filled with dielectric material, extending over side surfaces of the detector pixels to at least partially electrically isolate the detector pixels from each other;
   wherein each pixel's anode region is composed of a highly doped p-type or n-type semiconductor material and arranged in contact with the light absorbing region;
   wherein each pixel's cathode region is composed of a highly doped n-type or p-type semiconductor material of opposite type to the anode region and arranged in contact with the light absorbing region;
   wherein each pixel's potential barrier forming region is composed of a highly doped n-type or p-type semiconductor material of opposite type to the anode region and arranged between the anode region and the cathode region in contact with the light absorbing region; and wherein each pixel's ground region is composed of a highly doped p-type or n-type semiconductor material of the same types as the anode region and arranged in contact with the light absorbing region.

13. The photosensor array of claim 12, wherein a depletion region is created in the light absorbing region adjacent the anode region of each pixel when the pixel is switched from a reverse bias to a forward bias for sensing, and carriers of appropriate positive or negative charge type generated in the light absorbing region in response to photon absorption are induced by the forward bias to drift towards the depletion region, wherein in response to the carriers reaching the depletion region their associated charges cause a current between the anode and ground regions to increase, such that a threshold number of the carriers arriving at the depletion region is sufficient to induce a further current to start to flow between the anode and cathode regions.

14. The photosensor array of claim 12, wherein the insulating trenches comprise insulating material and further comprise metallic material embedded in the insulating material such that the metallic material is electrically isolated from the ground regions of the pixels.

15. The photosensor array of claim 12, wherein in each pixel the cathode region extends to its associated trenches.

16. The photosensor array of claim 12, wherein for each pixel said regions are concentrically arranged in plan view such that from outside inwards the regions are ordered: cathode region, potential barrier forming region, and anode region.

17. The photosensor array of claim 12, further comprising:
    anode and cathode contacts embedded in the respective anode and cathode regions of each pixel; and
    at least one ground contact connected to the pixels' ground regions.

18. The photosensor array of claim 17, wherein each pixel includes a further cathode contact embedded in the cathode region such that the potential barrier forming region lies between the cathode contact and the further cathode contact.

19. The photosensor array of claim 12, further comprising a separator region oppositely doped to the cathode region and arranged such that from outside inwards the regions are ordered: cathode region, separator region, potential barrier forming region, and anode region.

* * * * *